United States Patent
Sasagawa et al.

(10) Patent No.: US 10,347,769 B2
(45) Date of Patent: Jul. 9, 2019

(54) THIN FILM TRANSISTOR WITH MULTI-LAYER SOURCE/DRAIN ELECTRODES

(71) Applicant: SEMICONDUCTOR ENERGY LABORATORY CO., LTD., Atsugi-shi, Kanagawa-ken (JP)

(72) Inventors: Shinya Sasagawa, Kanagawa (JP); Motomu Kurata, Kanagawa (JP); Taiga Muraoka, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/204,365

(22) Filed: Mar. 11, 2014

(65) Prior Publication Data

US 2014/0284595 A1    Sep. 25, 2014

(30) Foreign Application Priority Data

Mar. 25, 2013  (JP) ................. 2013-061883

(51) Int. Cl.
*H01L 29/417* (2006.01)
*H01L 29/786* (2006.01)
(Continued)

(52) U.S. Cl.
CPC .... *H01L 29/7869* (2013.01); *H01L 29/41733* (2013.01); *H01L 29/458* (2013.01);
(Continued)

(58) Field of Classification Search
CPC ......... H01L 29/41733; H01L 29/78666; H01L 29/78675; H01L 29/458;
(Continued)

(56) References Cited

U.S. PATENT DOCUMENTS 5,731,856 A    3/1998   Kim et al.
5,744,864 A    4/1998   Cillessen et al.
(Continued)

FOREIGN PATENT DOCUMENTS

EP    1737044 A    12/2006
EP    2226847 A    9/2010
(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
(Continued)

*Primary Examiner* — Daniel Luke
(74) *Attorney, Agent, or Firm* — Nixon Peabody LLP; Jeffrey L. Costellia

(57) ABSTRACT

A semiconductor device for miniaturization is provided. The semiconductor device includes a semiconductor layer; a first electrode and a second electrode that are on the semiconductor layer and apart from each other over the semiconductor layer; a gate electrode over the semiconductor layer; and a gate insulating layer between the semiconductor layer and the gate electrode. The first and second electrodes comprise first conductive layers and second conductive layers. In a region overlapping with the semiconductor layer, the second conductive layers are positioned between the first conductive layers, and side surfaces of the second conductive layers are in contact with side surfaces of the first conductive layers. The second conductive layers have smaller thicknesses than those of the first conductive layers, and the top surface levels of the second conductive layers are lower than those of the first conductive layers.

9 Claims, 9 Drawing Sheets

(51) Int. Cl.
*H01L 29/45* (2006.01)
*H01L 21/02* (2006.01)

(52) U.S. Cl.
CPC .. *H01L 29/78618* (2013.01); *H01L 29/78666* (2013.01); *H01L 29/78675* (2013.01); *H01L 29/78696* (2013.01); *H01L 21/02521* (2013.01); *H01L 21/02554* (2013.01); *H01L 21/02565* (2013.01); *H01L 21/02631* (2013.01)

(58) Field of Classification Search
CPC ..... H01L 29/7869–78693; H01L 29/45; H01L 29/454; H01L 29/78618
See application file for complete search history.

(56) References Cited

U.S. PATENT DOCUMENTS

| | | | |
|---|---|---|---|
| 6,160,272 A * | 12/2000 | Arai | H01L 27/156 257/291 |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,906,342 B1 * | 6/2005 | Chang | H01L 27/12 257/184 |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,910,490 B2 | 3/2011 | Akimoto et al. | |
| 7,932,521 B2 | 4/2011 | Akimoto et al. | |
| 8,274,077 B2 | 9/2012 | Akimoto et al. | |
| 8,466,463 B2 | 6/2013 | Akimoto et al. | |
| 8,492,840 B2 | 7/2013 | Yamazaki et al. | |
| 8,501,564 B2 | 8/2013 | Suzawa et al. | |
| 8,766,252 B2 | 7/2014 | Yamazaki | |
| 8,785,241 B2 | 7/2014 | Sasagawa et al. | |
| 8,791,459 B2 * | 7/2014 | Moon | H01L 29/786 257/43 |
| 8,823,074 B2 | 9/2014 | Suzawa et al. | |
| 9,064,967 B2 | 6/2015 | Suzawa et al. | |
| 9,275,858 B2 | 3/2016 | Yamazaki | |
| 9,379,136 B2 | 6/2016 | Sasagawa et al. | |
| 9,640,642 B2 | 5/2017 | Sasagawa et al. | |
| 9,837,513 B2 | 12/2017 | Sasagawa et al. | |
| 9,837,544 B2 | 12/2017 | Yamazaki | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0029767 A1 * | 2/2008 | Nagata et al. | 257/72 |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2008/0308796 A1 | 12/2008 | Akimoto et al. | |
| 2008/0308805 A1 | 12/2008 | Akimoto et al. | |
| 2009/0008639 A1 | 1/2009 | Akimoto et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2009/0305461 A1 | 12/2009 | Akimoto et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0136743 A1 | 6/2010 | Akimoto et al. | |
| 2010/0244031 A1 * | 9/2010 | Akimoto | H01L 27/1225 257/57 |
| 2011/0104851 A1 | 5/2011 | Akimoto et al. | |
| 2011/0117697 A1 | 5/2011 | Akimoto et al. | |
| 2011/0121290 A1 | 5/2011 | Akimoto et al. | |
| 2011/0133177 A1 * | 6/2011 | Suzawa | H01L 27/1225 257/43 |
| 2011/0180796 A1 | 7/2011 | Yamazaki et al. | |
| 2012/0001169 A1 | 1/2012 | Yamazaki | |

(56) References Cited

U.S. PATENT DOCUMENTS

| | | | |
|---|---|---|---|
| 2012/0012836 A1* | 1/2012 | Sasagawa et al. ............ | 257/43 |
| 2013/0248850 A1* | 9/2013 | Choi ................ | H01L 29/66969 |
| | | | 257/43 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2011-139055 A | 7/2011 |
| JP | 2011-171721 A | 9/2011 |
| JP | 2012-039102 A | 2/2012 |
| JP | 2012-064923 A | 3/2012 |
| WO | WO-2004/114391 | 12/2004 |
| WO | WO-2011/068028 | 6/2011 |
| WO | WO-2011/089846 | 7/2011 |
| WO | WO-2012/002471 | 1/2012 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel, YbFe2O4, and Yb2Fe3O7 Types of Structures for Compounds in the In2O3 and SC2O3-A2O3-BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUs on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDs", Journal of the SID, 2007, vol. 15, No. 1, pp. 17-22.

Parks et al., "Challenge to Future Displays: Transparent AM-OLED Driven by PEALD Grown ZnO TFT", IMID '07 Digest, 2007, pp. 1249-1252.

Kikuchi.H et al., "62.2:Invited Paper:Fast Electro-Optical Switching in Polymer-Stabilized Liquld Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUs on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 639-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

(56) References Cited

OTHER PUBLICATIONS

Cho.D et al., "21.2:Al and Sn-Doped Zinc Indium Oxide Thin Film Transistors for AMOLED Back-Plane", SID Digest '09 ; SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M. "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90. No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study". Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Masuda.S et al., "Transparent thin film transistors using ZnO as an active channei layer and their electrical properties", J. Appl. Phys. (Journal of Applied Physics) , Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Nomura.K et al., "Carrier transport in transparent oxide semiconductor with intrinsic structural randomness probed using single-crystalline InGaOS(ZnO)5 films", Appl. Phys. Lett. (Applied Physics Letters) , Sep. 13, 2004, vol. 85, No. 11, pp. 1993-1995.

\* cited by examiner 101 106 111a 112a 103 102 112b 111b
104a 104b 103 105

107 108

100

101 106 109a 111a 112a 102 103 105 112b 111b 109b 107 108
104a 104b

THIN FILM TRANSISTOR WITH MULTI-LAYER SOURCE/DRAIN ELECTRODES

BACKGROUND OF THE INVENTION

1. Field of the Invention

One embodiment of the present invention relates to a semiconductor device. One embodiment of the present invention relates to a method for manufacturing the semiconductor device.

In this specification and the like, a semiconductor device means all types of devices that can function by utilizing semiconductor characteristics, and a transistor, a semiconductor circuit, a memory device, an imaging device, an electro-optical device, a power generation device (e.g., a thin film solar cell and an organic thin film solar cell), an electronic device, and the like are all semiconductor devices.

2. Description of the Related Art

A technique by which transistors are formed using semiconductor thin films formed over a substrate having an insulating surface has been attracting attention. The transistor is applied to a wide range of electronic devices such as an integrated circuit (IC) or an image display device (also simply referred to as a display device). As semiconductor thin films applicable to the transistors, silicon-based semiconductor materials have been widely used, but oxide semiconductors have been attracting attention as alternative materials.

For example, a technique by which a transistor is formed using zinc oxide or an In—Ga—Zn-based oxide semiconductor as an oxide semiconductor is disclosed (see Patent Documents 1 and 2).

In recent years, demand for an integrated circuit in which semiconductor elements such as a miniaturized transistor are integrated with high density has risen with increased performance and reductions in the size and weight of an electronic device.

REFERENCE

Patent Document

[Patent Document 1] Japanese Published Patent Application No. 2007-123861

[Patent Document 2] Japanese Published Patent Application No. 2007-096055

SUMMARY OF THE INVENTION

One object of one embodiment of the present invention is to provide a semiconductor device that is suitable for miniaturization.

Another object of one embodiment of the present invention is to provide a highly reliable semiconductor device. Another object of one embodiment of the present invention is to obtain a semiconductor device including an oxide semiconductor, which has favorable electrical characteristics.

Note that the descriptions of these objects do not disturb the existence of other objects. In one embodiment of the present invention, there is no need to achieve all the objects. Other objects are apparent from and can be derived from the description of the specification, the drawings, the claims, and the like.

One embodiment of the present invention is a semiconductor device including an island-shaped semiconductor layer over an insulating surface; a first electrode and a second electrode that are provided on and in contact with the semiconductor layer and apart from each other over the semiconductor layer; a gate electrode over the semiconductor layer; and a gate insulating layer between the semiconductor layer and the gate electrode. The first and second electrodes include first conductive layers and second conductive layers. Further, in a region overlapping with the island-shaped semiconductor layer, the second conductive layers are positioned between the first conductive layers, and part of a side surface of the second conductive layer is in contact with part of a side surface of the first conductive layer. The second conductive layer has a smaller thickness than the first conductive layer, and the top surface of the second conductive layer is lower than that of the first conductive layer.

The semiconductor layer of the semiconductor device of one embodiment of the present invention preferably includes an oxide semiconductor.

Another embodiment of the present invention is a manufacturing method of a semiconductor device that includes the following steps: forming an island-shaped semiconductor layer over an insulating surface; forming a first conductive film over the semiconductor layer; partly etching the first conductive film to form a pair of first conductive layers that are apart from each other over the island-shaped semiconductor layer; forming a second conductive film that is over the semiconductor layer and the pair of first conductive layers and has a smaller thickness than the first conductive film; forming an organic coating film over the second conductive film; forming a resist film over the organic coating film; processing the resist film so that the resist film is split in a region that overlaps with the semiconductor layer and does not overlap with the pair of first conductive layers; partly etching the organic coating film and the second conductive film using the resist film as a mask; etching the resist film and the upper portion of the organic coating film in this order to expose the second conductive film over the first conductive layers; partly etching the second conductive film over the first conductive layers using the organic coating film as a mask to expose the top surface of the first conductive layers, so that in a region overlapping with the island-shaped semiconductor layer, second conductive layers that are positioned between the first conductive layers and are in contact with side surfaces of the first conductive layers are formed; removing the organic coating film; forming a gate insulating layer over the semiconductor layer; and forming a gate electrode that is over the gate insulating layer and overlaps with the semiconductor layer.

For the processing of the resist film in the manufacturing method of a semiconductor device of one embodiment of the present invention, exposure is preferably performed using an electron beam, extreme ultraviolet light, or X-rays.

Further, a material including an oxide semiconductor is preferably used for the semiconductor layer.

According to one embodiment of the present invention, a semiconductor device that is suitable for miniaturization can be provided. Further, a highly reliable semiconductor device can be provided. Further, a semiconductor device formed using an oxide semiconductor can have favorable electrical characteristics.

DETAILED DESCRIPTION OF THE INVENTION

Figure 1A:
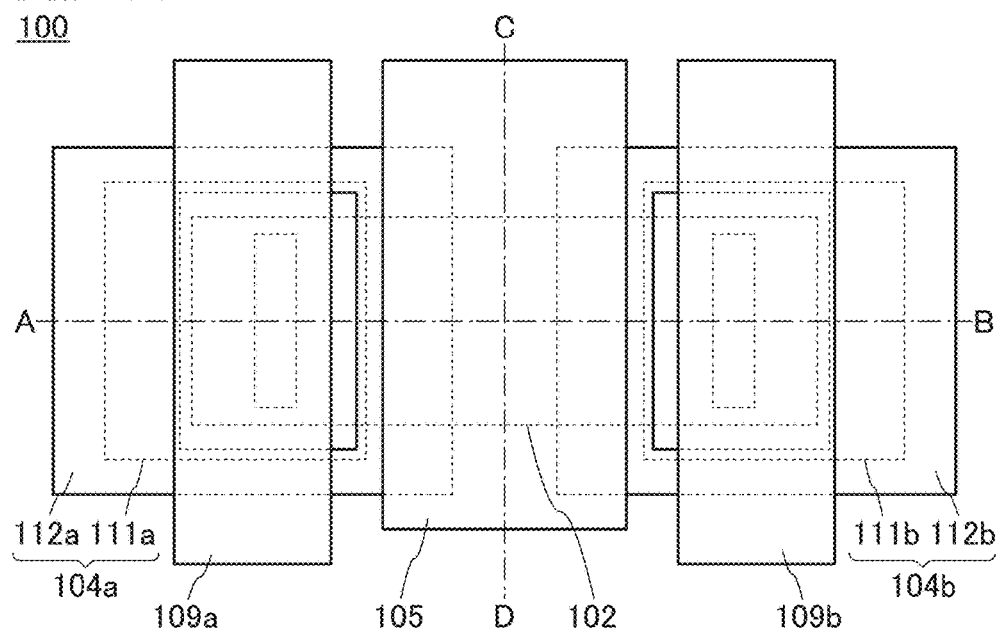
FIGS. 1A to 1C illustrate a structural example of a semiconductor device of an embodiment.

Embodiments are described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below.

Note that in the structures of the invention described below, the same portions or portions having similar functions are denoted by the same reference numerals in different drawings, and description of such portions is not repeated. Further, the same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, embodiments of the present invention are not limited to such a scale.

Note that in this specification and the like, ordinal numbers such as "first", "second", and the like are used in order to avoid confusion among components and do not limit the number.

Embodiment 1

In this embodiment, a structural example of a semiconductor device of one embodiment of the present invention and an example of a manufacturing method of the semiconductor device are described with reference to drawings. A transistor is described below as an example of the semiconductor device.

Structural Example

Figure 1B:
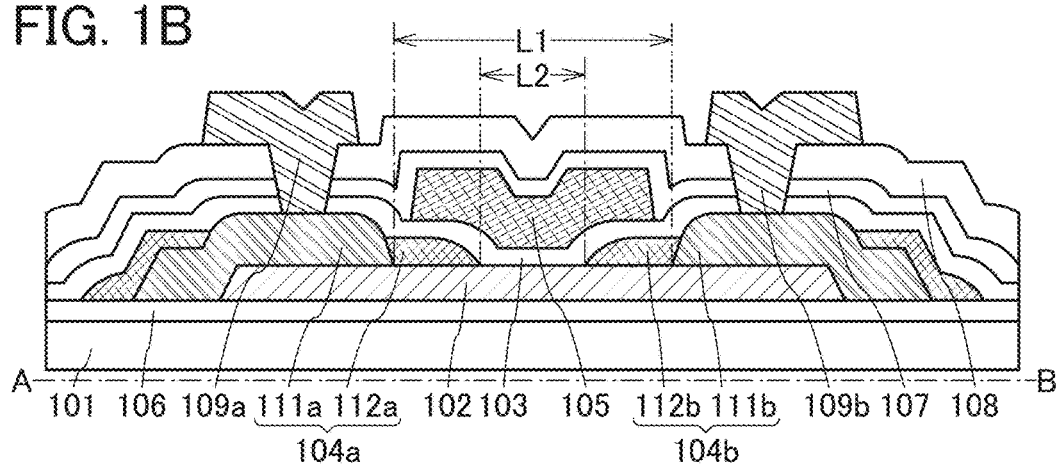
Figure 1C:
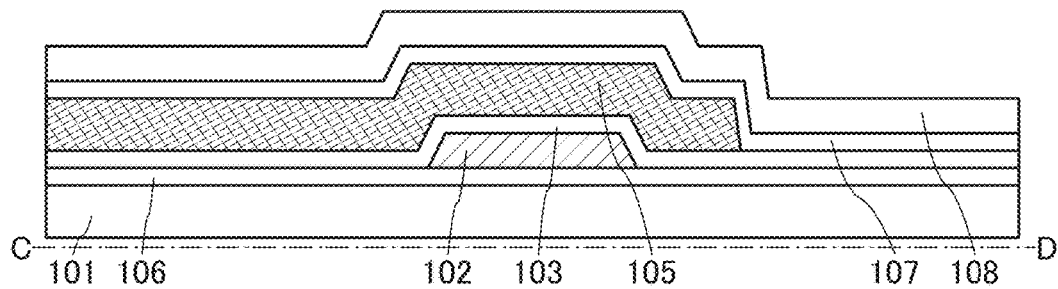

FIGS. 1A to 1C illustrate a transistor 100 that is an example described in this structural example. FIG. 1A is a schematic top view of the transistor 100. FIGS. 1B and 1C are schematic cross-sectional views taken along lines A-B and C-D in FIG. 1A, respectively.

The transistor 100 is formed over a substrate 101, and includes an island-shaped semiconductor layer 102 over the substrate 101, a first electrode 104a and a second electrode 104b that are in contact with the top surface of the semiconductor layer 102 and are apart from each other over the semiconductor layer 102, an insulating layer 103 over the semiconductor layer 102, the first electrode 104a, and the second electrode 104b, and a gate electrode 105 that is over the insulating layer 103 and overlaps with the semiconductor layer 102.

Further, an insulating layer 106 is provided between the semiconductor layer 102 and the substrate 101. Furthermore, an insulating layer 107 and an insulating layer 108 are formed in this order over the gate electrode 105. Moreover, wirings 109a and 109b are provided over the insulating layer 108. The wiring 109a is electrically connected to the first electrode 104a through an opening provided in the insulating layers 108, 107, and 103. The wiring 109b is electrically connected to the second electrode 104b through an opening provided in the insulating layers 108, 107, and 103. The wirings 109a and 109b may be provided as needed and are not necessarily provided.

The first electrode 104a includes a first conductive layer 111a and a second conductive layer 112a. The second conductive layer 112a is provided to surround the first conductive layer 111a. In a region overlapping with the semiconductor layer 102, in particular, the second conductive layer 112a is positioned between the first conductive layer 111a and the first conductive layer 111b. Part of a side surface of the second conductive layer 112a is in contact with part of a side surface of the first conductive layer 111a. The second conductive layer 112a has a smaller thickness than the first conductive layer 111a. The top surface level of the second conductive layer 112a is lower than that of the first conductive layer 111a.

As in the case of the first electrode 104a, the second electrode 104b includes a first conductive layer 111b and a second conductive layer 112b. The second conductive layer 112b is provided to surround the first conductive layer 111b. In a region overlapping with the semiconductor layer 102, in particular, the second conductive layer 112b is positioned between the first conductive layer 111a and the first conductive layer 111b. Part of a side surface of the second conductive layer 112b is in contact with part of a side surface of the first conductive layer 111b. The second conductive layer 112b has a smaller thickness than the first conductive layer 111b. The top surface level of the second conductive layer 112b is lower than that of the first conductive layer 111b.

Thus, as illustrated in FIG. 1B, in a region overlapping with the semiconductor layer 102, a distance L2 between the second conductive layer 112a and 112b is shorter than a distance L1 between the first conductive layers 111a and 111b.

The second conductive layer 112a does not have to surround the first conductive layer 111a but needs to be provided on the island-shaped semiconductor layer 102. Similarly, the second conductive layer 112b does not have to surround the first conductive layer 111b but needs to be provided on the island-shaped semiconductor layer 102.

In a region overlapping with the semiconductor layer 102, the second conductive layers 112a and 112b having smaller thicknesses than the first conductive layers 111a and 111b are provided between the first conductive layers 111a and 111b. Accordingly, the top surface level of the semiconductor layer 102 is lower than that of the second conductive layer 112a, and the top surface level of the second conductive layer 112a is lower than that of the first conductive layer 111a. Similarly, the height of the semiconductor layer 102 is lower than that of the second conductive layer 112b, and the height of the second conductive layer 112b is lower than that of the first conductive layer 111b.

As described above, the step difference of the first electrode 104a and the second electrode 104b is reduced, which improves the coverage with the insulating layer 103 covering the top surfaces of the first electrode 104a and the second electrode 104b. Further, the coverage with layers provided above the insulating layer 103, such as the gate electrode 105, the insulating layer 107, and the insulating layer 108, is also improved.

In each of the second conductive layers 112a and 112b, an end portion that is closer to the center of the semiconductor layer 102 increases the thickness continuously, that is, has a tapered shape. Thus, coverage with the insulating layer 103 is further improved at a step difference between the semiconductor layer 102 and the second conductive layer 112a or 112b.

Since the first electrode 104a and the second electrode 104b each include two conductive layers having different thicknesses, the resistance of the electrodes can be lowered by the thick first conductive layer 111a or 111b without sacrificing the coverage with layers provided above the first electrode 104a and the second electrode 104b.

As described above, the coverage with the insulating layer 103 and the gate electrode 105 is improved, which enables the insulating layer 103 and the gate electrode 105 to be formed thin. To reduce the thickness of the insulating layer 103 can improve the electrical characteristics of the transistor 100. In addition, as a result of the improved coverage with the insulating layer 103, a decrease in gate withstand voltage of the transistor 100 can be suppressed. Further, the thickness of the gate electrode 105 is preferably small because minuter and more stable processing is possible.

Components of the transistor 100 are described below.
<Semiconductor Layer>

Examples of a semiconductor applicable to the semiconductor layer 102 in which a channel of the transistor 100 is formed include a semiconductor material such as silicon or germanium, a compound semiconductor material, an organic semiconductor material, and an oxide semiconductor material.

Further, there is no particular limitation on the crystallinity of a semiconductor used for the semiconductor layer 102, and an amorphous semiconductor or a semiconductor having crystallinity (a microcrystalline semiconductor, a polycrystalline semiconductor, a single crystal semiconductor, a semiconductor partly including crystal regions, or a semiconductor including crystal regions in the whole area) may be used. A semiconductor having crystallinity is preferably used, in which case deterioration of transistor characteristics can be reduced.

For example, in the case of using silicon as the semiconductor, amorphous silicon, microcrystalline silicon, polycrystalline silicon, single crystal silicon, or the like can be used.

In the case of using an oxide semiconductor as the semiconductor, an oxide semiconductor containing at least one of indium, gallium, and zinc is preferably used. Typically, an In—Ga—Zn-based metal oxide or the like can be given. An oxide semiconductor having a wider band gap and a lower carrier density than silicon is preferably used because off-state leakage current can be reduced.

Note that details of a preferable mode and a forming method of an oxide semiconductor applicable to the semiconductor layer 102 are described in an embodiment below.

A case in which an oxide semiconductor is used for the semiconductor layer 102 is described below.
<Substrate>

There is no particular limitation on the property of a material and the like of the substrate 101 as long as the material has heat resistance enough to withstand at least heat treatment in the process. For example, a glass substrate, a ceramic substrate, a quartz substrate, a sapphire substrate, or an yttria-stabilized zirconia (YSZ) substrate may be used as the substrate 101. Alternatively, a single crystal semiconductor substrate or a polycrystalline semiconductor substrate made of silicon, silicon carbide, or the like, a compound semiconductor substrate made of silicon germanium or the like, an SOI substrate, or the like can be used as the substrate 101.

Still alternatively, a component in which a semiconductor element is provided over a semiconductor substrate or an SOI substrate may be used as the substrate 101. In this case, the transistor 100 is formed over the substrate 101 with an interlayer insulating layer provided therebetween. The transistor 100 in this case may have a structure in which at least one of the gate electrode 105, the first electrode 104a, and the second electrode 104b is electrically connected to the above semiconductor element by a connection electrode buried in the interlayer insulating layer. The transistor 100 is provided over the semiconductor element with the interlayer insulating layer provided therebetween, which can suppress an increase in area due to provision of the transistor 100.

Still alternatively, a flexible substrate such as a plastic substrate may be used as the substrate 101, and the transistor 100 may be provided directly on the flexible substrate. Further alternatively, a separation layer may be provided between the substrate 101 and the transistor 100. The separation layer can be used when part or the whole of the transistor is formed over the separation layer, separated from the substrate 101, and transferred to another substrate. Thus, the transistor 100 can be transferred to a substrate having low heat resistance or a flexible substrate.
<Gate electrode>

The gate electrode 105 can be formed using a metal selected from aluminum, chromium, copper, tantalum, titanium, molybdenum, and tungsten; an alloy containing any of these metals as a component; an alloy containing any of these metals in combination; or the like. Further, one or more metals selected from manganese and zirconium may be used. Furthermore, the gate electrode 105 may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film containing aluminum and one or more metals selected from titanium, tantalum, tungsten, molybdenum, chromium, neodymium, and scandium; or a nitride film of the alloy film may be used.

The gate electrode 105 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal.

Further, an In—Ga—Zn-based oxynitride semiconductor film, an In—Sn-based oxynitride semiconductor film, an In—Ga-based oxynitride semiconductor film, an In—Zn-based oxynitride semiconductor film, a Sn-based oxynitride semiconductor film, an In-based oxynitride semiconductor film, a film of metal nitride (such as InN or ZnN), or the like may be provided between the gate electrode 105 and the insulating layer 103. These films each have a work function higher than or equal to 5 eV, preferably higher than or equal to 5.5 eV, which is higher than the electron affinity of the oxide semiconductor. Thus, the threshold voltage of the transistor including an oxide semiconductor can be shifted in the positive direction, and what is called a normally-off switching element can be achieved. For example, as an In—Ga—Zn-based oxynitride semiconductor film, an In—Ga—Zn-based oxynitride semiconductor film having a higher nitrogen concentration than at least the semiconductor layer 102, specifically an In—Ga—Zn-based oxynitride semiconductor film having a nitrogen concentration higher than or equal to 7 at. %, is used.

<Gate Insulating Layer>

The insulating layer 103 serves as a gate insulating layer.

The insulating layer 103 may be formed to have a single-layer structure or a stacked-layer structure using, for example, one or more of silicon oxide, silicon oxynitride, silicon nitride oxide, silicon nitride, aluminum oxide, hafnium oxide, gallium oxide, Ga—Zn-based metal oxide, silicon nitride, and the like.

The insulating layer 103 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, so that gate leakage current of the transistor can be reduced.

<First Electrode and Second Electrode>

The first electrode 104a and the second electrode 104b function as source and drain electrodes of the transistor 100.

The first conductive layer 111a and the second conductive layer 112a that are included in the first electrode 104a and the first conductive layer 111b and the second conductive layer 112b that are included in the second electrode 104b can be formed to have a single-layer structure or a stacked-layer structure including any of metals such as aluminum, titanium, chromium, nickel, copper, yttrium, zirconium, molybdenum, silver, tantalum, and tungsten or an alloy containing any of these metals as its main component. Alternatively, a nitride of the above metals or the above alloy may be used.

For example, a single-layer structure of an aluminum film containing silicon, a two-layer structure in which a titanium film is stacked over an aluminum film, a two-layer structure in which a titanium film is stacked over a tungsten film, a two-layer structure in which a copper film is stacked over a copper-magnesium-aluminum alloy film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used.

Here, the first conductive layers 111a and 111b are formed by processing the same conductive film (or the same stacked-layer conductive film). Similarly, the second conductive layers 112a and 112b are formed by processing the same conductive film (or the same stacked-layer conductive film).

The material used for the first conductive layers 111a and 111b may be the same as that used for the second conductive layers 112a and 112b, but is preferably different from that used for the second conductive layers 112a and 112b. In an example of a manufacturing method described later, the top surfaces of the first conductive layers 111a and 111b are exposed in some cases at the time of processing the second conductive layers 112a and 112b; thus, the material used for the first conductive layers is preferably different from that used for the second conductive layers to make a difference in the etching rates of the first conductive layers and the second conductive layers.

For example, when a metal such as tungsten is used for the first conductive layers 111a and 111b and a metal nitride such as titanium nitride is used for the second conductive layers 112a and 112b, these etching rates can differ greatly from each other, which increases stability of processing.

<Insulating Layer>

The insulating layer 106 serves as a barrier layer that prevents diffusion of impurities contained in the substrate 101.

At least one of the insulating layers 106 and 107 is preferably formed using an oxide insulating film containing oxygen at a higher proportion than oxygen in the stoichiometric composition. Part of oxygen is released by heating from the oxide insulating film containing oxygen at a higher proportion than oxygen in the stoichiometric composition. The oxide insulating film containing oxygen at a higher proportion than oxygen in the stoichiometric composition is an oxide insulating film in which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS) analysis.

As the insulating layer 106 or 107, for example, silicon oxide, silicon oxynitride, or the like can be used.

Note that the insulating layer 107 also functions as a film which relieves damage to the transistor at the time of forming the insulating layer 108 later.

An oxide film that permeates oxygen may be provided below the insulating layer 107.

As the oxide film transmitting oxygen, a silicon oxide film, a silicon oxynitride film, or the like can be formed. Note that in this specification, "silicon oxynitride film" refers to a film that contains more oxygen than nitrogen, and "silicon nitride oxide film" refers to a film that contains more nitrogen than oxygen.

The insulating layer 108 can be formed using an insulating film having a blocking effect against oxygen, hydrogen, water, and the like. It is possible to prevent outward diffusion of oxygen from the semiconductor layer 102 and entry of hydrogen, water, or the like into the semiconductor layer 102 from the outside by providing the insulating layer 108 over the insulating layer 107. As for the insulating film having a blocking effect against oxygen, hydrogen, water, and the like, a silicon nitride film, a silicon nitride oxide film, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given as examples.

A structure that includes the above insulating film having a blocking effect of against oxygen, hydrogen, water, and the like as the insulating layer 107 and does not include the insulating layer 108 may be used. Alternatively, a stacked-layer structure including the insulating layer 107 having such a blocking effect and the insulating layer 108 may be used. The stacked-layer structure including the insulating layers 107 and 108 can improve the blocking effect and the planarity of the upper portion of the transistor 100.

The above is the description of the structural examples of the transistor 100.

[Example of Manufacturing Method]

An example of a manufacturing method of the transistor 100 in FIGS. 1A to 1C is described below with reference to the drawings. FIGS. 2A to 4D are schematic cross-sectional views of each step in the example of the manufacturing method described below.

<Formation of Insulating Layer>

First, the insulating layer 106 is formed over the substrate 101.

The insulating layer 106 is formed by a sputtering method, a chemical vapor deposition (CVD) method, an evaporation method, or the like.

In order to make the insulating layer 106 excessively contain oxygen, the insulating layer 106 may be formed in an oxygen atmosphere, for example. Alternatively, the insulating layer 106 may excessively contain oxygen in such a manner that oxygen is introduced into the insulating layer 106 that has been formed. Both the methods may be combined.

For example, oxygen (at least including any of oxygen radicals, oxygen atoms, and oxygen ions) is introduced into the insulating layer 106 that has been formed, whereby a region excessively containing oxygen is formed. As a method for introducing oxygen, an ion implantation method, an ion doping method, a plasma immersion ion implantation method, plasma treatment, or the like can be employed.

A gas containing oxygen can be used for oxygen introducing treatment. As the gas containing oxygen, oxygen, dinitrogen monoxide, nitrogen dioxide, carbon dioxide, carbon monoxide, and the like can be used. Further, a rare gas may be included in the gas containing oxygen for the oxygen introduction treatment.

<Formation of Semiconductor Layer>

Figure 2A:
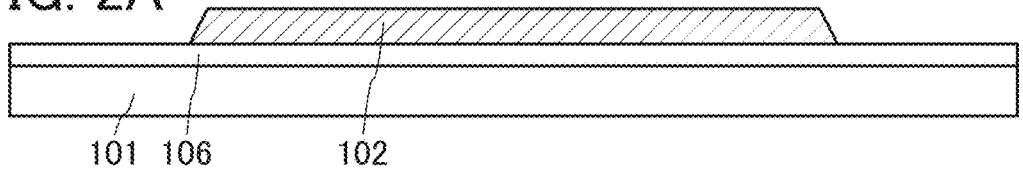
FIGS. 2A to 2E illustrate a manufacturing method of the semiconductor device of the embodiment.

An oxide semiconductor film is formed and then processed into an island shape by a processing method such as photolithography, so that the island-shaped semiconductor layer 102 is formed (FIG. 2A).

The oxide semiconductor film can be formed by a sputtering method, a CVD method, a molecular beam epitaxy (MBE) method, an atomic layer deposition (ALD) method, a pulse laser deposition (PLD) method, or the like. The oxide semiconductor film is preferably formed by a sputtering method. As a sputtering method, an RF sputtering method, a DC sputtering method, an AC sputtering method, or the like can be used. In particular, a DC sputtering method is preferably used because dust generated in the deposition can be reduced and the film thickness can be uniform.

Note that heat treatment may be performed after the formation of the oxide semiconductor film. The heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the heat treatment may be performed in such a manner that heat treatment is performed in an inert gas atmosphere, and then another heat treatment is performed in an atmosphere containing an oxidization gas at 10 ppm or more, in order to compensate released oxygen. By the heat treatment, oxygen is supplied from the insulating layer 106 to the oxide semiconductor film (or the semiconductor layer 102), which enables a reduction in oxygen vacancies in the oxide semiconductor included in the semiconductor layer 102. Note that the heat treatment may be performed at any timing after the formation of the oxide semiconductor film. The heat treatment may be performed before the processing of the oxide semiconductor film or may be performed after the formation of the semiconductor layer 102 by the processing of the oxide semiconductor film.

<Formation of First Conductive Layer>

Figure 2B:
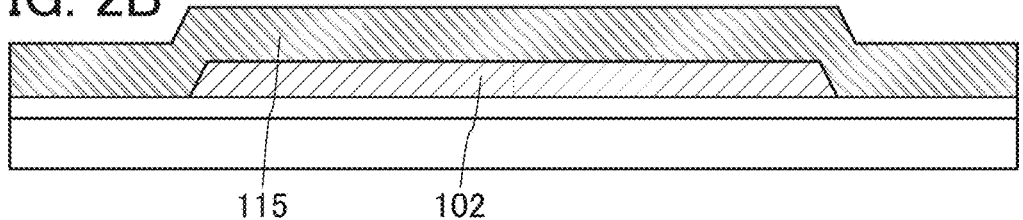

Next, a first conductive film 115 is formed over the insulating layer 106 and the semiconductor layer 102 (FIG. 2B).

The first conductive film 115 is to be the first conductive layers 111a and 111b later. The first conductive film 115 is formed by a sputtering method or the like.

Figure 2C:
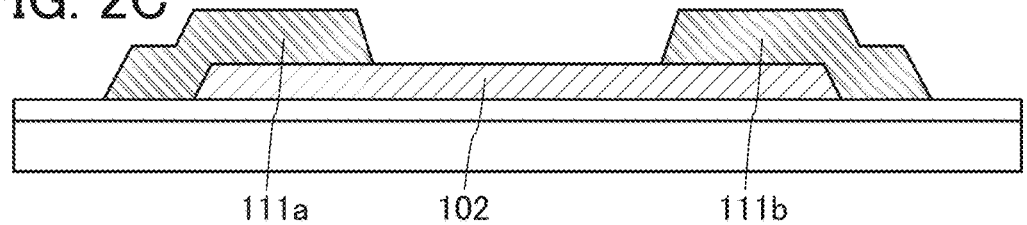

Then, the first conductive film 115 is partly removed by a processing method such as photolithography, so that the first conductive layers 111a and 111b are formed (FIG. 2C).

Here, at the time of processing the first conductive film 115, in some cases, part of the top surface of the semiconductor layer 102 is etched, which results in a reduction in thickness of the semiconductor layer 102. Thus, the semiconductor layer 102 is preferably formed thick in advance.

<Formation of Second Conductive Film>

Figure 2D:
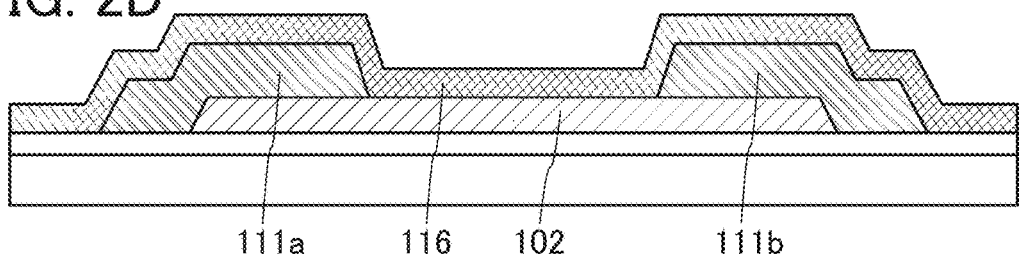

Next, a second conductive film 116 is formed over the insulating layer 106, the semiconductor layer 102, and the first conductive layers 111a and 111b (FIG. 2D).

The second conductive film 116 is to be the second conductive layers 112a and 112b later. The second conductive film 116 is formed by a sputtering method or the like.

The top surface of a region of the second conductive film 116 that does not overlap with the first conductive layer 111a or 111b is lower than the top surface of the first conductive layer 111a or 111b. As the second conductive film 116, for example, a film (stacked-layer film) having a smaller thickness than the first conductive film 115 is formed.

<Formation of Organic Coating Film and Resist Film>

Figure 2E:
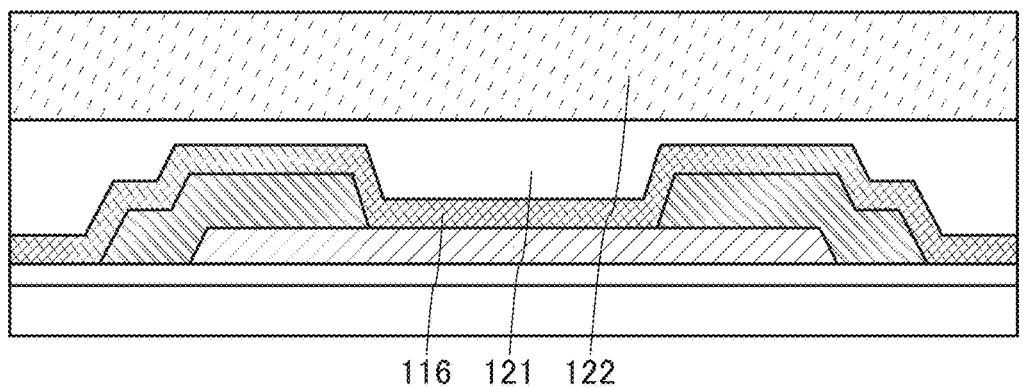

Next, an organic coating film 121 is formed over the second conductive film 116. After that, a resist film 122 is formed over the organic coating film 121 (FIG. 2E).

For the resist film 122, a photosensitive organic resin that is also referred to as a photoresist may be used. For example, a positive photoresist or a negative photoresist can be used. The resist film 122 can be formed to have a uniform thickness by a spin coating method or the like.

For the organic coating film 121, a non-photosensitive organic resin is used. Here, the organic coating film 121 may have a function of improving adhesion between a processed film (in this case, the second conductive film 116) and the resist film 122. Further, the organic coating film 121 may have a light-blocking property and serve as an anti-reflective film suppressing the following phenomenon, for example: at the time of later exposure, light is transmitted through the resist film 122 and is then reflected at the surface of any of the processed film, the substrate 101, a stage supporting the substrate 101, and the like to transmit through the resist film 122 again. Examples of such an organic coating film serving as an anti-reflective film include bottom anti-reflection coating (BARC).

The organic coating film 121 can be formed by a spin coating method or the like. In the case where there is unevenness below the organic coating film 121, the organic coating film 121 preferably covers the unevenness. Forming the organic coating film 121 in this manner can suppress variation in thickness of the resist film 122 over the organic coating film 121, failure of exposure, and variation in width of the resist film 122.

<Exposure and Development of Resist Film>

Next, exposure is performed on the resist film 122. As light for the exposure, light with an i-line (wavelength: 365 nm), light with a g-line (wavelength: 436 nm), light with an h-line (wavelength: 405 nm), light in which the i-line, the g-line, and the h-line are mixed, or the like can be used, and the resist film 122 can be irradiated with any of the above light through a photomask. Exposure may be performed by liquid immersion exposure technique. As the light for the exposure, extreme ultra-violet light (EUV) or X-rays may be used. Instead of the light for the exposure, an electron beam can be used. It is preferable to use extreme ultra-violet light (EUV), X-rays, or an electron beam because extremely minute processing can be performed. Note that in the case of performing exposure by scanning of a beam such as an electron beam, a photomask is not needed.

Figure 3A:
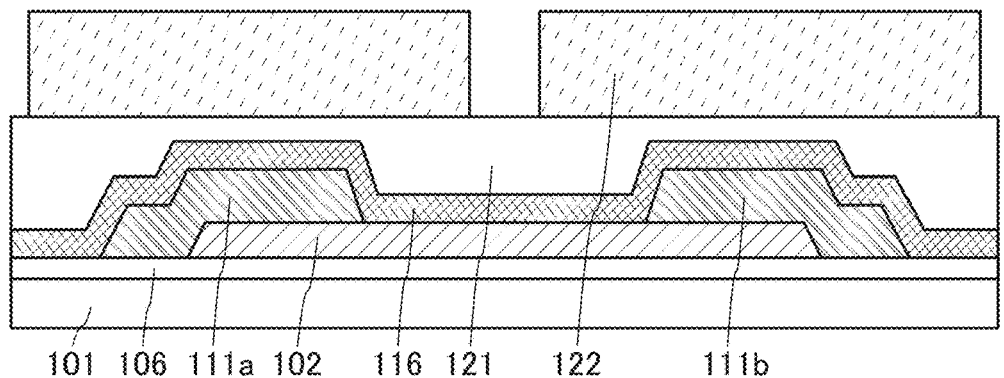
FIGS. 3A to 3D illustrate a manufacturing method of the semiconductor device of the embodiment.

In this example of the manufacturing method, a negative resist is used as the resist film 122, and exposure is performed by scanning of an electron beam. After that, development treatment is performed on the resist film 122, so that a non-exposure portion of the resist film 122 is removed (FIG. 3A).

By the exposure and development treatment, the resist film 122 is split in a region overlapping with the semiconductor layer 102 and not overlapping with the first conductive layers 111*a* and 111*b*. In other words, in a region overlapping with the semiconductor layer 102, the resist film 122 is processed so that the resist film 122 overlaps with the first conductive layer 111*a* or 111*b* and an end portion of the resist film 122 is positioned between the first conductive layer 111*a* and 111*b*.

<Etching of Organic Coating Film and Second Conductive Film>

Figure 3B:
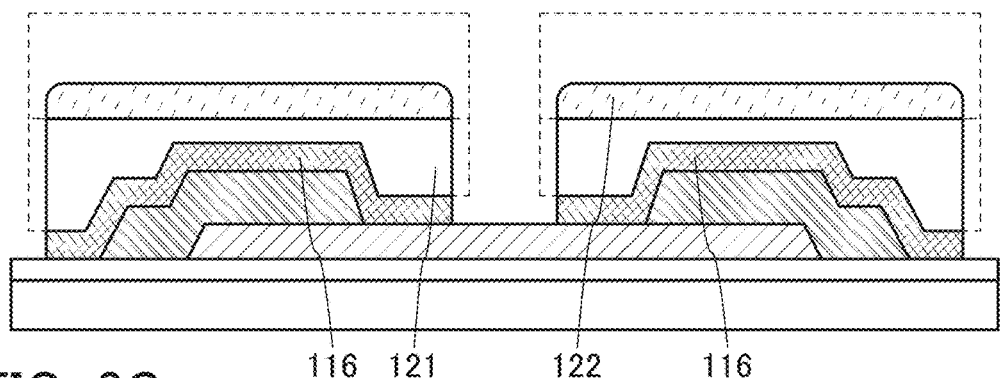

Next, portions of the organic coating film 121 and the second conductive film 116 that are not covered with the resist film 122 are removed by etching using the resist film 122 as a mask (FIG. 3B). At this time, the second conductive film 116 is split at the region overlapping with the semiconductor layer 102.

The etching of the organic coating film 121 and the second conductive film 116 can be either dry etching or wet etching. In the case of minute processing, in particular, it is preferable that the organic coating film 121 and the second conductive film 116 be etched successively by anisotropic dry etching.

In the case where the organic coating film 121 and the second conductive film 116 are etched by dry etching, as illustrated in FIG. 3B, the upper portion of the resist film 122 is also etched, which results in a reduction in thickness of the resist film 122. Further, side surfaces of the resist film 122 and the organic coating film 121 are also etched in some cases.

<Formation of Second Conductive Layer>

Figure 3C:
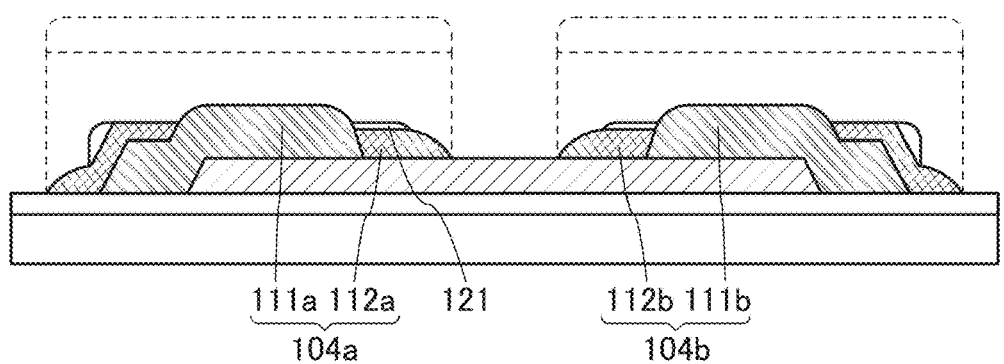

Next, the resist film 122, the organic coating film 121, and the second conductive film 116 are etched successively from the upper to lower films (also referred to as etched-back) by anisotropic dry etching. At this time, part of the second conductive film 116 in contact with the top surfaces of the first conductive layers 111*a* and 111*b* are removed to expose the top surfaces, so that the second conductive layers 112*a* and 112*b* are formed (FIG. 3C).

The etching process is described below. First, the resist film 122 is removed by the etching, so that the top surface of the organic coating film 121 is exposed. Next, the organic coating film 121 is etched from the top, whereby the second conductive film 116 overlapping with the first conductive layer 111*a* or 111*b* is partly exposed. Then, the organic coating film 121 and the exposed second conductive film 116 are partly etched, so that the top surfaces of the first conductive layers 111*a* and 111*b* are exposed. At this time, the organic coating film 121 is not removed by the etching process and remains over the second conductive film 116 in a portion not overlapping with the first conductive layer 111*a* or 111*b*. Thus, this portion of the second conductive film 116 is not removed by the etching because the organic coating film 121 serves as a mask, and the second conductive layers 112*a* and 112*b* are formed to surround the first conductive layer 111*a* and 111*b*, respectively.

As described above, the second conductive layers 112*a* and 112*b* are formed to have the following structures: in a region overlapping with the island-shaped semiconductor layer 102, the second conductive layer 112*a* is positioned between the first conductive layers 111*a* and 111*b* and the second conductive layer 112*a* is in contact with the side surface of the first conductive layer 111*a*; and in a region overlapping with the island-shaped semiconductor layer 102, the second conductive layer 112*b* is positioned between the first conductive layers 111*a* and 111*b* and the second conductive layer 112*b* is in contact with the side surface of the first conductive layer 111*b*.

It is preferable to use different materials for the first conductive film 115 to be the first conductive layers 111*a* and 111*b* and the second conductive film 116 to be the second conductive layers 112*a* and 112*b* so that the second conductive film 116 has a higher etching rate than the first conductive film 115. Such an etching condition can prevent the top surface levels of the first conductive layers 111*a* and 111*b* from being lower than those of the second conductive layers 112*a* and 112*b* because of the etching.

By the etching, a side surface of the organic coating film 121 is also etched. Part of the second conductive film 116 is etched while the side surface of the organic coating film 121 is receding gradually, so that the end portions of the second conductive layers 112*a* and 112*b* can be processed to have tapered shapes.

As illustrated in FIG. 3C, angular portions in the exposed regions of the first conductive layers 111*a* and 111*b* are also etched, so that the end portions are processed into rounded shapes in some cases. It is preferable to have such shapes because the coverage with a layer (e.g., the insulating layer 103) formed over the first conductive layers 111*a* and 111*b* can be improved.

Although angular shapes of components are exaggerated in the drawings, any angular portion may be rounded with a specific curvature radius.

Here, it is preferable that a series of etching from the etching of the organic coating film 121 and the second conductive film 116 using the resist film 122 as a mask to the etching for forming the second conductive layers 112*a* and 112*b* be successively performed using one apparatus.

The distance between the second conductive layers 112*a* and 112*b* corresponds to a channel length of the transistor 100. The distance is preferably short because the on-state current of the transistor 100 increases as the distance becomes shorter. For example, the distance is less than or equal to 100 nm, preferably less than or equal to 50 nm, more preferably less than or equal to 30 nm, still more preferably less than or equal to 20 nm.

<Removal of Organic Coating Film>

Figure 3D:
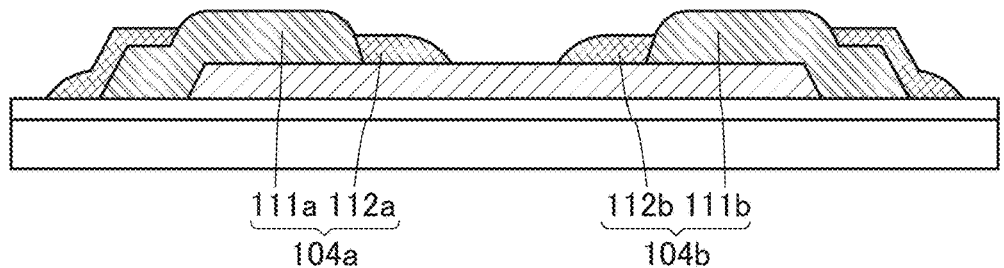

Next, the remaining organic coating film 121 is removed (FIG. 3D).

As a method for removing the organic coating film 121, for example, a removal method using a resist stripper or the like is given. Alternatively, the organic coating film 121 may be decomposed and removed by plasma treatment in an atmosphere containing oxygen. Further alternatively, such treatments may be performed in combination. Here, in the case where the resist film 122 partly remains or in the case where a reaction product of the resist film 122 or the organic coating film 121 is attached, they can be removed by this step, too.

<Formation of Gate Insulating Layer>

Figure 4A:
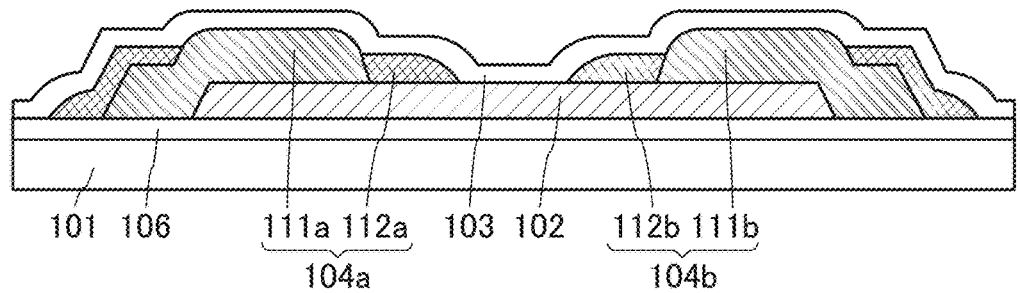
FIGS. 4A to 4D illustrate a manufacturing method of the semiconductor device of the embodiment.

Next, the insulating layer 103 is formed over the semiconductor layer 102, the first electrode 104a, and the second electrode 104b (FIG. 4A). The insulating layer 103 is in contact with the top surface of the first conductive layer 111a, the top surface of the first conductive layer 111b, the second conductive layer 112a, and the second conductive layer 112b.

The insulating layer 103 can be formed by a sputtering method, a CVD method, an MBE method, an ALD method, a PLD method, or the like. In particular, it is preferable that the insulating layer 103 be formed by a CVD method, further preferably a plasma CVD method because coverage can be further improved.

After the formation of the insulating layer 103, heat treatment is preferably performed. By the heat treatment, an impurity such as water or hydrogen contained in the gate insulating layer 103 can be released (dehydration or dehydrogenation can be performed). The heat treatment may be performed under conditions similar to the above-described conditions.

<Formation of Gate Electrode>

Figure 4B:
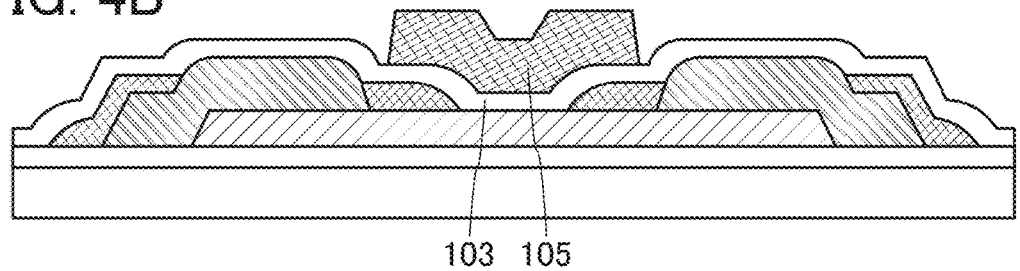

Next, a conductive film is formed over the insulating layer 103, and an unnecessary portion of the conductive film is etched by a processing method such as photolithography, so that the gate electrode 105 is formed (FIG. 4B).

The conductive film to be the gate electrode 105 is formed by a sputtering method or the like.

In processing of the second conductive film 116, in order that the top surfaces are to be in contact with the insulating layer 103, portions of the second conductive film 116 that are in contact with the top surfaces of the first conductive layers 111a and 111b are removed. Thus, when the conductive film to be the gate electrode 105 is formed over the first electrode 104a and the second electrode 104b, the step difference of the conductive film is reduced as compared to that of the structure in which the second conductive layers 112a and 112b cover the first conductive layers 111a and 111b. As a result, the resist film for processing the conductive film has a smaller variation in thickness due to the step difference of the conductive film, so that the resist film can be formed thin. As the thickness of resist film becomes smaller, the resolution in exposure can increase, which enables minuter processing.

<Formation of Insulating Layer>

Figure 4C:
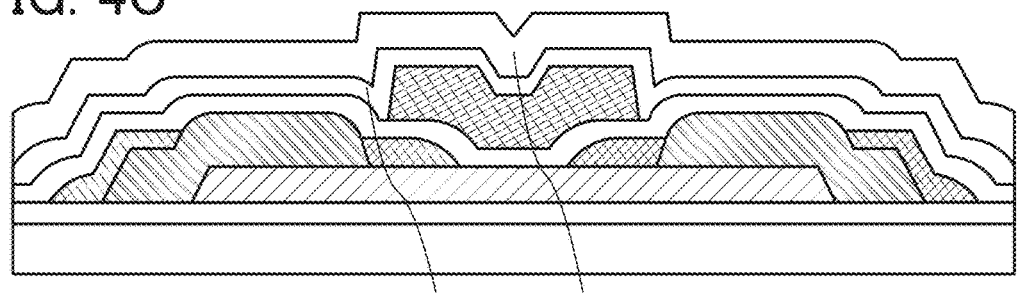
Figure 4D:
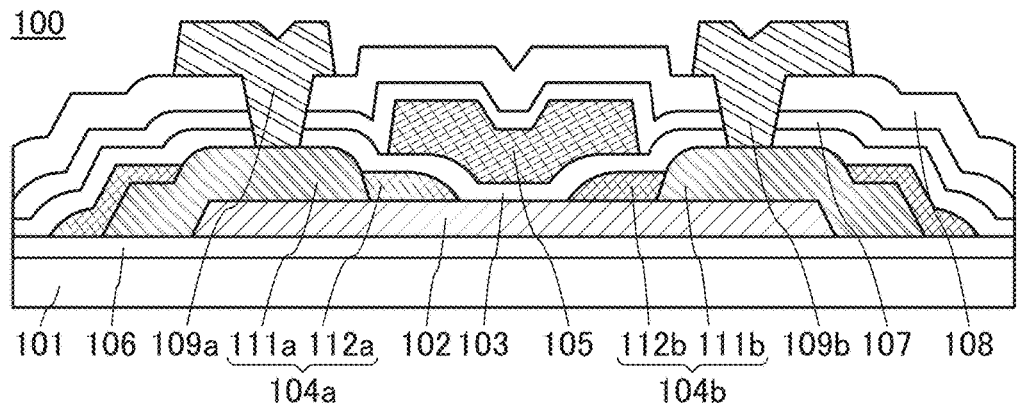

Next, the insulating layer 107 is formed over the insulating layer 103 and the gate electrode 105, and then the insulating layer 108 is formed over the insulating layer 107 (FIG. 4C).

The insulating layers 107 and 108 each can be formed by a sputtering method, a CVD method, an MBE method, an ALD method, a PLD method, or the like. In particular, it is preferable that the insulating layers 107 and 108 each be formed by a CVD method, further preferably a plasma CVD method, because favorable coverage can be obtained.

In the case of forming a silicon oxide film or a silicon oxynitride film as the insulating layer 107 by a plasma CVD method, a deposition gas containing silicon and an oxidizing gas are preferably used as a source gas. Typical examples of the deposition gas containing silicon include silane, disilane, trisilane, and silane fluoride. As the oxidizing gas, oxygen, ozone, dinitrogen monoxide, nitrogen dioxide, and the like can be given as examples.

For example, a silicon oxide film or a silicon oxynitride film is formed under the conditions as follows: the substrate placed in a vacuum-evacuated treatment chamber of a plasma CVD apparatus is held at a temperature higher than or equal to 180° C. and lower than or equal to 260° C., preferably higher than or equal to 200° C. and lower than or equal to 240° C., a source gas is introduced into the treatment chamber, the pressure is greater than or equal to 100 Pa and less than or equal to 250 Pa, preferably greater than or equal to 100 Pa and less than or equal to 200 Pa, and high-frequency power higher than or equal to 0.17 W/cm$^2$ and lower than or equal to 0.5 W/cm$^2$, preferably higher than or equal to 0.25 W/cm$^2$ and lower than or equal to 0.35 W/cm$^2$ is supplied to an electrode provided in the treatment chamber.

As the film formation conditions, the high-frequency power having the above power density is supplied to the treatment chamber having the above pressure, whereby the decomposition efficiency of the source gas in plasma is increased, oxygen radicals are increased, and oxidation of the source gas is promoted; therefore, oxygen is contained in the oxide insulating film at a higher proportion than oxygen in the stoichiometric composition. However, in the case where the substrate temperature is within the above temperature range, the bond between silicon and oxygen is weak, and accordingly, part of oxygen is released by heating. Thus, it is possible to form an oxide insulating film which contains oxygen at a higher proportion than the stoichiometric composition and from which part of oxygen is released by heating.

In the case where the insulating layer 108 is formed using a silicon nitride film or a silicon nitride oxide film, a deposition gas containing silicon, an oxidizing gas, and a gas containing nitrogen are preferably used as a source gas. Typical examples of the deposition gas containing silicon include silane, disilane, trisilane, and silane fluoride. As the oxidizing gas, oxygen, ozone, dinitrogen monoxide, and nitrogen dioxide can be given as examples. As the gas containing nitrogen, nitrogen and ammonia can be given as examples.

After the formation of the insulating layers 107 and 108, heat treatment is preferably performed. Oxygen released from the insulating layer 107 by heat treatment is supplied to the semiconductor layer 102, which enables a reduction in oxygen vacancies in the oxide semiconductor included in the semiconductor layer 102. The heat treatment may be performed under conditions similar to the above-described conditions.

<Formation of Wiring>

Next, the insulating layers 108, 107, and 103 are partly etched, so that openings reaching the first electrode 104a and the second electrode 104b are formed.

Then, a conductive film is formed over the insulating layer 108, the first electrode 104a, and the second electrode 104b, and the conductive film is partly etched by a processing method such as photolithography, so that the wirings 109a and 109b are formed.

For the conductive film to be the wirings 109a and 109b, a conductive material that can be used for any of the gate electrode 105, the first electrode 104a, and the second electrode 104b may be used. The conductive film can be formed by a sputtering method, or the like.

Although not illustrated, a wiring electrically connected to the gate electrode 105 may be formed at the same time as the formation of the wirings 109a and 109b.

Through the above steps, the transistor 100 can be manufactured.

MODIFICATION EXAMPLE

A structural example of a transistor that has a partly different structure from the transistor 100 described in the above structural example is described below.

Modification Example 1

Figure 5A:
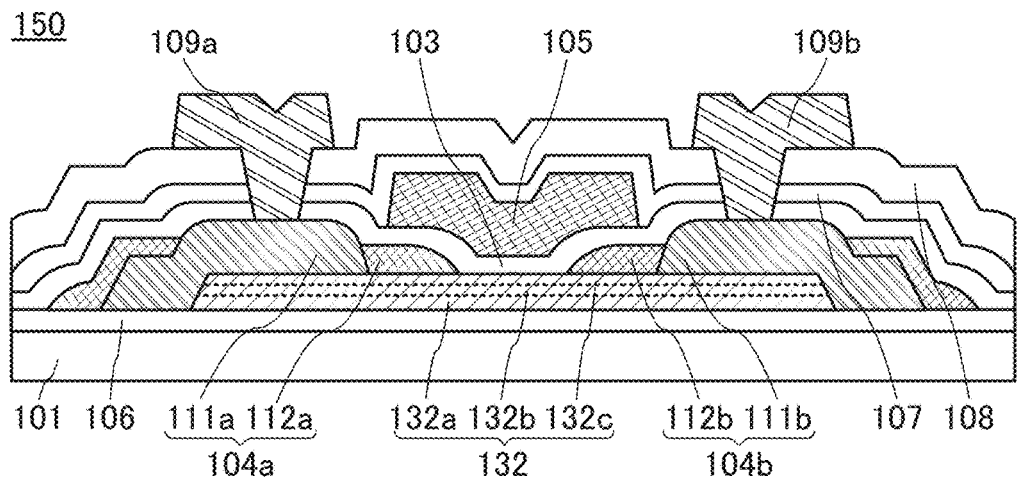
FIGS. 5A to 5C each illustrate a structural example of a semiconductor device of an embodiment.

FIG. 5A is a schematic cross-sectional view of the transistor 150 described below as an example. The structure of a semiconductor layer in the transistor 150 is different from that in the transistor 100.

A semiconductor layer 132 of the transistor 150 has a stacked-layer structure in which a first semiconductor layer 132a, a second semiconductor layer 132b, and a third semiconductor layer 132c are stacked in this order. The first semiconductor layer 132a, the second semiconductor layer 132b, and the third semiconductor layer 132c each include an oxide semiconductor.

A boundary between the first semiconductor layer 132a and the second semiconductor layer 132b and a boundary between the second semiconductor layer 132b and the third semiconductor layer 132c are unclear in some cases; thus, these boundaries are shown by dashed lines in FIG. 5A and the like.

For example, for the second semiconductor layer 132b, an In—Ga oxide, an In—Zn oxide, or an In-M-Zn oxide (M represents Al, Ti, Ga, Y, Zr, La, Ce, Nd, or Hf) is typically used. In the case of using an In-M-Zn oxide as the second semiconductor layer 132b, when summation of In and M is assumed to be 100 atomic %, the proportions of In and M are preferably greater than or equal to 25 atomic % and less than 75 atomic %, respectively, and more preferably greater than or equal to 34 atomic % and less than 66 atomic %, respectively. Further, for the second semiconductor layer 132b, a material having an energy gap of 2 eV or more, preferably 2.5 eV or more, further preferably 3 eV or more is used, for example.

For example, the first semiconductor layer 132a and the third semiconductor layer 132c each contain In or Ga; the first semiconductor layer 132a and the third semiconductor layer 132c each contain, for example, a material typified by an In—Ga oxide, an In—Zn oxide, or an In-M-Zn oxide (M is Al, Ti, Ga, Y, Zr, La, Ce, Nd, or HO. In addition, energy of the conduction band bottom of each of the first semiconductor layer 132a and the third semiconductor layer 132c is closer to the vacuum level than the second semiconductor layer 132b is. The difference between the energy of the conduction band bottom of the second semiconductor layer 132b and the energy of the conduction band bottom of each of the first semiconductor layer 132a and the third semiconductor layer 132c is preferably 0.05 eV or more, 0.07 eV or more, 0.1 eV or more, or 0.15 eV or more and 2 eV or less, 1 eV or less, 0.5 eV or less, or 0.4 eV or less.

When an In-M-Zn oxide is used for the first semiconductor layer 132a or the third semiconductor layer 132c, the proportions of In and M when summation of In and M is assumed to be 100 atomic % is preferably as follows: the atomic percentage of In is less than 50 at. % and the atomic percentage of M is greater than or equal to 50 at. %; further preferably, the atomic percentage of In is less than 25 at. % and the atomic percentage of M is greater than or equal to 75 at. %.

For the first semiconductor layer 132b, an In—Ga—Zn oxide containing In, Ga, and Zn at an atomic ratio of 1:1:1 or 3:1:2 can be used, for example. For the first semiconductor layer 132a or the third semiconductor layer 132c, an In—Ga—Zn oxide containing In, Ga, and Zn at an atomic ratio of 1:3:4, 1:3:6, 1:6:8, or 1:6:10 can be used, for example. Note that the atomic ratio of each of the first semiconductor layer 132a, the second semiconductor layer 132b, and the third semiconductor layer 132c varies within a range of ±20% as an error. The first semiconductor layer 132a and the third semiconductor layer 132c may be formed using materials having the same composition or materials having different compositions.

For each of the first semiconductor layer 132a and the third semiconductor layer 132c between which the second semiconductor layer 132b is sandwiched, an oxide that contains a larger amount of Ga serving as a stabilizer than the second semiconductor layer 132b is used, which can suppress release of oxygen from the semiconductor layer 132.

Further, the first semiconductor layer 132a and the third semiconductor layer 132c are each formed using a material whose energy of the conduction band bottom is closer to the vacuum level than the energy of the conduction band bottom of the second semiconductor layer 132b is. Accordingly, a channel is formed mainly in the second semiconductor layer 132b, and the second semiconductor layer 132b serves as a main current path. When the structure in which the second semiconductor layer 132b in which a channel is formed is sandwiched between the first semiconductor layer 132a and the third semiconductor layer 132c that contain the same constituent element as described above, generation of interface states between these layers is suppressed, and thus reliability of electrical characteristics in terms of the transistor is improved.

Note that, without limitation to that described above, a material with an appropriate composition may be used depending on required semiconductor characteristics and electrical characteristics (e.g., field-effect mobility and threshold voltage) of a transistor. Further, in order to obtain the required semiconductor characteristics of the transistor, it is preferable that the carrier density, the impurity concentration, the defect density, the atomic ratio of a metal element to oxygen, the interatomic distance, the density, and the like of the first semiconductor layer 132a, the second semiconductor layer 132b, and the third semiconductor layer 132c be set to appropriate values.

Although a structure in which three oxide semiconductor layers are stacked is described above as an example of the semiconductor layer 132, a structure in which two or four or more oxide semiconductor layers are stacked can also be employed.

Modification Example 2

Figure 5B:
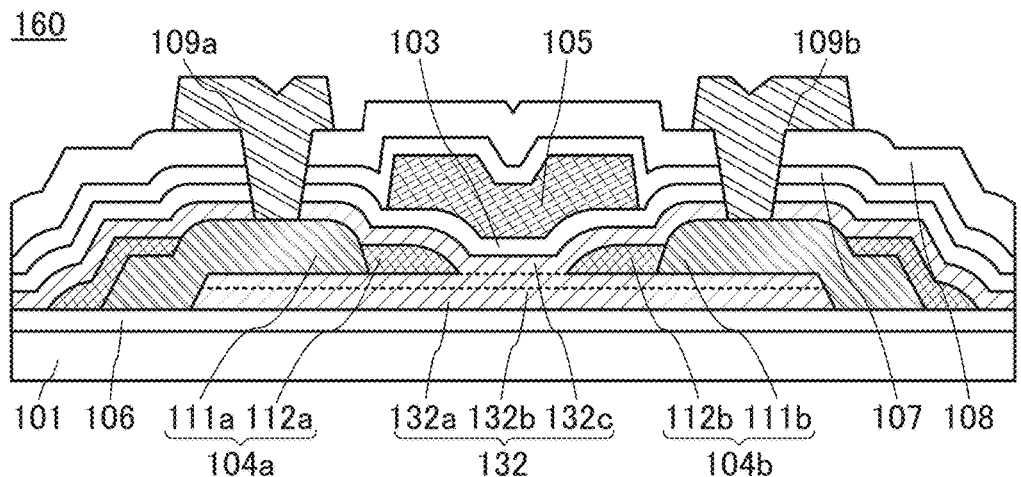

FIG. 5B is a schematic cross-sectional view of a transistor 160 described below as an example. The structure of a semiconductor layer in the transistor 160 is different from that in the transistor 150.

The third semiconductor layer 132c of the semiconductor layer 132 included in the transistor 160 is provided over the first electrode 104a, the second electrode 104b, and the second semiconductor layer 132b.

Such a structure in which the first electrode 104a and the second electrode 104b are in contact with the second semiconductor layer 132b in which a channel can be mainly formed can increase the on-state current of the transistor 160.

Modification Example 3

Figure 5C:
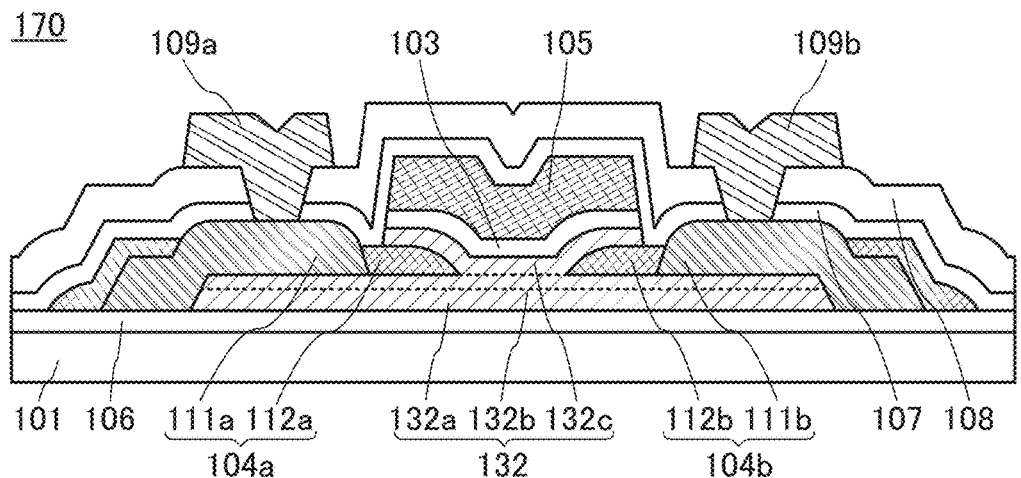

FIG. 5C is a cross-sectional schematic diagram of a transistor 170 described below. The structures of a semiconductor layer, a gate insulating layer, and the like in the transistor 170 are different from those in the transistors 150 and 160.

The third semiconductor layer 132c of the semiconductor layer 132 included in the transistor 170 is provided to cover an end portion of the second conductive layer 112a of the first electrode 104a, an end portion of the second conductive layer 112b of the second electrode 104b, and the second semiconductor layer 132b.

To substantially align end portions of the third semiconductor layer 132c and the insulating layer 103 with an end portion of the gate electrode 105, the third semiconductor layer 132c, the insulating layer 103, and the gate electrode 105 are processed using the same photomask.

The insulating layer 107 is provided in contact with side surfaces of the third semiconductor layer 132c and the insulating layer 103.

The above is the description of the modification example.

Note that this embodiment can be combined with any of the other embodiments and examples described in this specification as appropriate.

Embodiment 2

An oxide semiconductor that can be favorably used for a semiconductor layer of a semiconductor device of one embodiment of the present invention is described in this embodiment.

An oxide semiconductor has a wide energy gap of 3.0 eV or more. A transistor including an oxide semiconductor film obtained by processing of the oxide semiconductor in an appropriate condition and a sufficient reduction in carrier density of the oxide semiconductor can have much lower leakage current between a source and a drain in an off state (off-state current) than a conventional transistor including silicon.

When an oxide semiconductor film is used for the transistor, the thickness of the oxide semiconductor film is preferable greater than or equal to 2 nm to less than or equal to 40 nm.

An applicable oxide semiconductor preferably contains at least indium (In) or zinc (Zn). In particular, In and Zn are preferably contained. In addition, as a stabilizer for reducing variation in electrical characteristics of the transistor using the oxide semiconductor, one or more selected from gallium (Ga), tin (Sn), hafnium (HO), zirconium (Zr), titanium (Ti), scandium (Sc), yttrium (Y), and an lanthanoid (such as cerium (Ce), neodymium (Nd), or gadolinium (Gd), for example) is preferably contained.

As the oxide semiconductor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Here, an "In—Ga—Zn-based oxide" means an oxide containing In, Ga, and Zn as its main components and there is no particular limitation on the ratio of In:Ga:Zn. The In—Ga—Zn-based oxide may contain a metal element other than the In, Ga, and Zn.

Alternatively, a material represented by $InMO_3(ZnO)_m$, (m>0 is satisfied, and m is not an integer) may be used as an oxide semiconductor. Note that M represents one or more metal elements selected from Ga, Fe, Mn, and Co, or the above-described element as a stabilizer. Alternatively, as the oxide semiconductor, a material expressed by a chemical formula, $In_2SnO_5(ZnO)_n$ (n>0, n is an integer) may be used.

For example, In—Ga—Zn-based oxide with an atomic ratio of In:Ga:Zn=1:1:1, 1:3:2, 1:3:4, 1:3:6, 3:1:2, or 2:1:3, or an oxide whose composition is in the neighborhood of the above compositions may be used.

Note that if the oxide semiconductor film contains a large amount of hydrogen, the hydrogen and the oxide semiconductor are bonded to each other, so that part of the hydrogen serves as a donor and causes generation of an electron that is a carrier. As a result, the threshold voltage of the transistor shifts in the negative direction. Therefore, it is preferable that, after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is also reduced by the dehydration treatment (dehydrogenation treatment) in some cases. Therefore, it is preferable that oxygen be added to the oxide semiconductor film to fill oxygen vacancies increased by the dehydration treatment (dehydrogenation treatment). In this specification and the like, supplying oxygen to an oxide semiconductor film may be expressed as oxygen adding treatment, or treatment for making the oxygen content of an oxide semiconductor film be in excess of that of the stoichiometric composition may be expressed as treatment for making an oxygen-excess state.

In this manner, hydrogen or moisture is removed from the oxide semiconductor film by the dehydration treatment (dehydrogenation treatment) and oxygen vacancies therein are filled the oxygen adding treatment, so that the oxide semiconductor film can be an i-type (intrinsic) oxide semiconductor film or an oxide semiconductor film extremely close to an i-type oxide semiconductor (a substantially i-type oxide semiconductor). Note that "substantially intrinsic" means that the oxide semiconductor film includes extremely few (close to zero) carriers derived from a donor, and the carrier concentration thereof is lower than or equal to $1\times10^{17}/cm^3$, lower than or equal to $1\times10^{16}/cm^3$, lower than or equal to $1\times10^{15}/cm^3$, lower than or equal to $1\times10^{14}/cm^3$, or lower than or equal to $1\times10^{13}/cm^3$.

In this manner, the transistor including an i-type or substantially i-type oxide semiconductor film can have extremely favorable off-state current characteristics. For example, the drain current at the time when the transistor including an oxide semiconductor film is in an off-state at room temperature (25° C.) can be less than or equal to $1\times10^{-18}$ A, preferably less than or equal to $1\times10^{-21}$ A, and further preferably $1\times10^{-24}$ A; or at 85° C., less than or equal to $1\times10^{-15}$ A, preferably $1\times10^{-18}$ A, further preferably less than or equal to $1\times10^{-21}$ A. An off state of a transistor refers to a state where gate voltage is lower than the threshold voltage in an n-channel transistor. Specifically, the transistor is in an off state when the gate voltage is lower than the threshold voltage by 1V or more, 2V or more, or 3V or more.

A structure of an oxide semiconductor film is described below.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films having a plurality of c-axis aligned crystal parts.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or the top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

Note that in an electron diffraction pattern of the CAAC-OS film, spots (bright spots) having alignment are shown. For example, spots are observed in an electron diffraction pattern (also referred to as a nanobeam electron diffraction pattern) of the top surface of the CAAC-OS film that is obtained using an electron beam with a diameter of, for example, larger than or equal to 1 nm and smaller than or equal to 30 nm.

From the results of the cross-sectional TEM image and the plan TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 $nm^2$ or more, 5 $\mu m^2$ or more, or 1000 $\mu m^2$ or more is observed in some cases in the plan TEM image.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of the top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned with a direction parallel to a normal vector of a formation surface or a normal vector of the top surface. Thus, for example, in the case where a shape of the CAAC-OS film is changed by etching or the like, the c-axis might not be necessarily parallel to a normal vector of a formation surface or a normal vector of the top surface of the CAAC-OS film.

Further, distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Further, in the CAAC-OS film to which an impurity is added, a region to which the impurity is added is altered, and the proportion of the c-axis aligned crystal parts in the CAAC-OS film varies depending on regions, in some cases.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor that includes the oxide semiconductor film having high impurity concentration and a high density of defect states has unstable electrical characteristics in some cases.

With use of the CAAC-OS film in a transistor, variation in the electrical characteristics of the transistor due to irradiation with visible light or ultraviolet light is small.

Next, a polycrystalline oxide semiconductor film is described.

In an image obtained with a TEM, crystal grains can be found in the polycrystalline oxide semiconductor film. In most cases, the size of a crystal grain in the polycrystalline oxide semiconductor film is greater than or equal to 2 nm and less than or equal to 300 nm, greater than or equal to 3 nm and less than or equal to 100 nm, or greater than or equal to 5 nm and less than or equal to 50 nm in an image obtained with the TEM, for example. Moreover, in an image obtained with the TEM, a boundary between crystals can be found in the polycrystalline oxide semiconductor film in some cases.

The polycrystalline oxide semiconductor film may include a plurality of crystal grains, and alignment of crystals may be different in the plurality of crystal grains. A polycrystalline oxide semiconductor film is subjected to structural analysis with an XRD apparatus. For example, when the polycrystalline oxide semiconductor film including an $InGaZnO_4$ crystal is analyzed by an out-of-plane method, peaks of 2q appear at around 31°, 36°, and the like in some cases.

The polycrystalline oxide semiconductor film has high crystallinity and thus has high electron mobility in some cases. Accordingly, a transistor including the polycrystalline oxide semiconductor film has high field-effect mobility. Note that there are cases in which an impurity is segregated at the grain boundary between the crystals in the polycrystalline oxide semiconductor film. Moreover, the grain boundary of the polycrystalline oxide semiconductor film becomes a defect state. Since the grain boundary of the polycrystalline oxide semiconductor film may serve as a carrier trap or a carrier generation source, a transistor including the polycrystalline oxide semiconductor film has larger variation in electrical characteristics and lower reliability than a transistor including a CAAC-OS film in some cases.

Next, a microcrystalline oxide semiconductor film is described.

In an image obtained with the TEM, crystal parts cannot be found clearly in the microcrystalline oxide semiconductor in some cases. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal (nc) is referred to as an nc-OS (nanocrystalline oxide semiconductor) film. In an image obtained with TEM, a crystal grain cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Further, there is no regularity of crystal orientation between different crystal parts in the nc-OS film; thus, the orientation of the whole film is not observed. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than that of a crystal part, a peak that shows a crystal plane does not appear. Further, a halo pattern is shown in a selected-area electron diffraction pattern of the nc-OS film obtained by using an electron beam having a probe diameter (e.g., larger than or equal to 50 nm) larger than a diameter of a crystal part. Meanwhile, spots are shown in a nanobeam electron diffraction pattern of the nc-OS film obtained by using an electron beam having a probe diameter (e.g., larger than or equal to 1 nm and smaller than or equal to 30 nm) close to, or smaller than or equal to a diameter of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases.

Since the nc-OS film is an oxide semiconductor film having more regularity than the amorphous oxide semiconductor film, the nc-OS film has a lower density of defect states than the amorphous oxide semiconductor film. However, there is no regularity of crystal orientation between different crystal parts in the nc-OS film; hence, the nc-OS film has a higher density of defect states than the CAAC-OS film.

Thus, the nc-OS film may have a higher carrier density than the CAAC-OS film. The oxide semiconductor film having a high carrier density may have high electron mobility. Thus, a transistor including the nc-OS film may have high field-effect mobility. The nc-OS film has a higher defect state density than the CAAC-OS film, and thus may have a lot of carrier traps. Consequently, a transistor including the nc-OS film has larger variation in electrical characteristics and lower reliability than a transistor including the CAAC-OS film. The nc-OS film can be formed easily as compared to the CAAC-OS film because nc-OS film can be formed even when a relatively large amount of impurities are included; thus, depending on the purpose, the nc-OS film can be favorably used in some cases. Therefore, a semiconductor device including the transistor including the nc-OS film can be manufactured with high productivity in some cases.

Next, an amorphous oxide semiconductor film is described.

The amorphous oxide semiconductor film has disordered atomic arrangement and no crystal part. For example, the amorphous oxide semiconductor film does not have a specific state as in quartz.

In an image obtained with a TEM, crystal parts cannot be found in the amorphous oxide semiconductor film.

When the amorphous oxide semiconductor film is subjected to structural analysis by an out-of-plane method with an XRD apparatus, a peak that shows a crystal plane does not appear. A halo pattern is shown in an electron diffraction pattern of the amorphous oxide semiconductor film. Further, a halo pattern is shown but a spot is not shown in a nanobeam electron diffraction pattern of the amorphous oxide semiconductor film.

The amorphous oxide semiconductor film contains impurities such as hydrogen at a high concentration. In addition, the amorphous oxide semiconductor film has a high density of defect states.

The oxide semiconductor film having a high impurity concentration and a high density of defect states has many carrier traps or many carrier generation sources.

Accordingly, the amorphous oxide semiconductor film has a much higher carrier density than the nc-OS film. Therefore, a transistor including the amorphous oxide semiconductor film tends to be normally on. Thus, in some cases, such an amorphous oxide semiconductor film can be applied to a transistor that needs to be normally on. Since the amorphous oxide semiconductor film has a high density of defect states, carrier traps might be increased. Consequently, a transistor including the amorphous oxide semiconductor film has larger variation in electrical characteristics and lower reliability than a transistor including the CAAC-OS film or the nc-OS film.

Next, a single-crystal oxide semiconductor film is described.

The single-crystal oxide semiconductor film has a lower impurity concentration and a lower density of defect states (few oxygen vacancies). Thus, the carrier density can be decreased. Accordingly, a transistor including the single-crystal oxide semiconductor film is unlikely to be normally on. Moreover, since the single-crystal oxide semiconductor film has a lower impurity concentration and a lower density of defect states, carrier traps might be reduced. Thus, the transistor including the single-crystal oxide semiconductor film has small variation in electrical characteristics and accordingly has high reliability.

Note that when the oxide semiconductor film has few defects, the density thereof is increased. When the oxide semiconductor film has high crystallinity, the density thereof is increased. When the oxide semiconductor film has a lower concentration of impurities such as hydrogen, the density thereof is increased. The single-crystal oxide semiconductor film has a higher density than the CAAC-OS film. The CAAC-OS film has a higher density than the microcrystalline oxide semiconductor film. The polycrystalline oxide semiconductor film has a higher density than the microcrystalline oxide semiconductor film. The microcrystalline oxide semiconductor film has a higher density than the amorphous oxide semiconductor film.

Note that an oxide semiconductor film may be a stacked film including two or more films of an amorphous oxide semiconductor film, a microcrystalline oxide semiconductor film, and a CAAC-OS film, for example.

Embodiment 3

In this embodiment, a structural example of a display panel including a semiconductor device of one embodiment of the present invention is described.

Structural Example

Figure 6A:
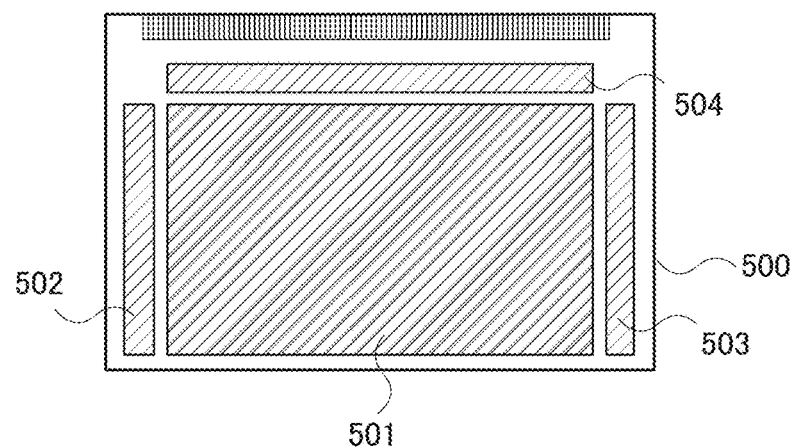
FIGS. 6A to 6C illustrate a display panel of an embodiment.
Figure 6B:
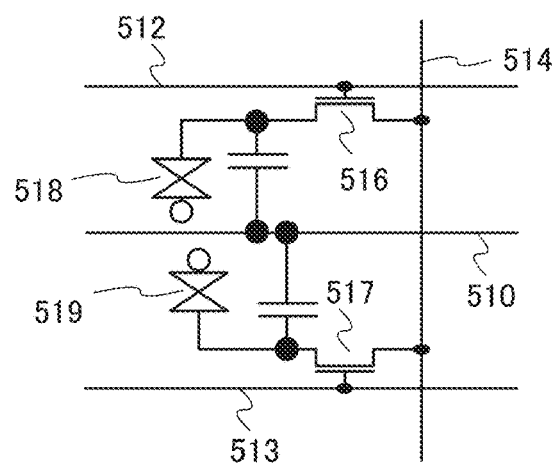
Figure 6C:
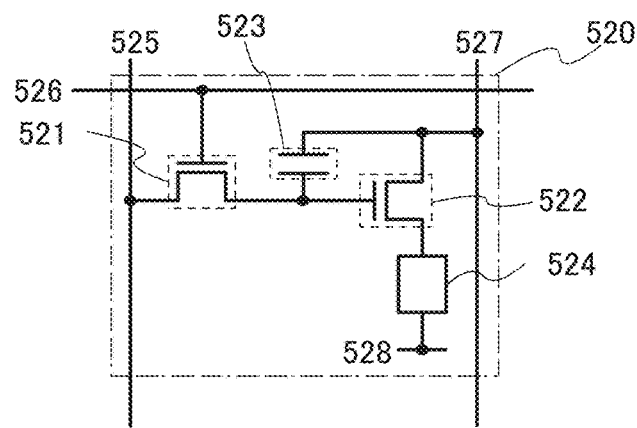

FIG. 6A is a top view of the display panel of one embodiment of the present invention. FIG. 6B illustrates a pixel circuit that can be used in the case where a liquid crystal element is used in a pixel in the display panel of one embodiment of the present invention. FIG. 6C illustrates a pixel circuit that can be used in the case where an organic EL element is used in a pixel in the display panel of one embodiment of the present invention.

The transistor in the pixel portion can be formed in accordance with Embodiment 1. Further, the transistor can be easily formed as an n-channel transistor, and thus part of a driver circuit that can be formed using an n-channel transistor can be formed over the same substrate as the transistor of the pixel portion. With the use of the transistor described in Embodiment 1 for the pixel portion or the driver circuit in this manner, a highly reliable display device can be provided.

FIG. 6A illustrates an example of a block diagram of an active matrix display device. A pixel portion 501, a first scan line driver circuit 502, a second scan line driver circuit 503, and a signal line driver circuit 504 are provided over a substrate 500 in the display device. In the pixel portion 501, a plurality of signal lines extended from the signal line driver circuit 504 are arranged and a plurality of scan lines extended from the first scan line driver circuit 502 and the second scan line driver circuit 503 are arranged. Note that pixels that include display elements are provided in a matrix in respective regions where the scan lines and the signal lines intersect with each other. The substrate 500 of the display device is connected to a timing control circuit (also referred to as a controller or a controller IC) through a connection portion such as a flexible printed circuit (FPC).

In FIG. 6A, the first scan line driver circuit 502, the second scan line driver circuit 503, and the signal line driver circuit 504 are formed over the same substrate 500 as the pixel portion 501. Accordingly, the number of components that are provided outside, such as a drive circuit, is reduced, so that a reduction in cost can be achieved. Further, in the case where the driver circuit is provided outside the substrate 500, wirings would need to be extended and the number of connections of wirings would be increased. When the driver circuit is provided over the substrate 500, the number of connections of the wirings can be reduced. Consequently, an improvement in reliability or yield can be achieved.

<Liquid Crystal Panel>

FIG. 6B illustrates an example of a circuit configuration of the pixel. Here, a pixel circuit that is applicable to a pixel of a VA liquid crystal display panel is illustrated.

This pixel circuit can be applied to a structure in which one pixel includes a plurality of pixel electrode layers. The pixel electrode layers are connected to different transistors, and the transistors can be driven with different gate signals. Accordingly, signals applied to individual pixel electrode layers in a multi-domain pixel can be controlled independently.

A gate wiring 512 of a transistor 516 and a gate wiring 513 of a transistor 517 are separated so that different gate signals can be supplied thereto. In contrast, a source or drain electrode 514 functioning as a data line is shared by the transistors 516 and 517. The transistor described in Embodiment 1 can be used as appropriate as each of the transistors 516 and 517. Thus, a highly reliable liquid crystal display panel can be provided.

The shapes of a first pixel electrode layer electrically connected to the transistor 516 and a second pixel electrode layer electrically connected to the transistor 517 are described. The first pixel electrode layer and the second pixel electrode layer are separated by a slit. The first pixel electrode layer has a V shape and the second pixel electrode layer is provided so as to surround the first pixel electrode layer.

A gate electrode of the transistor 516 is connected to the gate wiring 512, and a gate electrode of the transistor 517 is connected to the gate wiring 513. When different gate signals are supplied to the gate wiring 512 and the gate wiring 513, operation timings of the transistor 516 and the transistor 517 can be varied. As a result, alignment of liquid crystals can be controlled.

Further, a storage capacitor may be formed using a capacitor wiring 510, a gate insulating film functioning as a dielectric, and a capacitor electrode electrically connected to the first pixel electrode layer or the second pixel electrode layer.

The multi-domain pixel includes a first liquid crystal element 518 and a second liquid crystal element 519. The first liquid crystal element 518 includes the first pixel electrode layer, a counter electrode layer, and a liquid crystal layer therebetween. The second liquid crystal element 519 includes the second pixel electrode layer, a counter electrode layer, and a liquid crystal layer therebetween.

Note that a pixel circuit of the present invention is not limited to that shown in FIG. 6B. For example, a switch, a resistor, a capacitor, a transistor, a sensor, a logic circuit, or the like may be added to the pixel illustrated in FIG. 6B. A semiconductor device manufactured by a manufacturing method of a semiconductor device of one embodiment of the present invention can be used also for an element or a circuit included in the pixel circuit.

<Organic EL Panel>

FIG. 6C illustrates another example of a circuit configuration of the pixel. Here, a pixel structure of a display panel using an organic EL element is shown.

In an organic EL element, by application of voltage to a light-emitting element, electrons are injected from one of a pair of electrodes and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

FIG. 6C illustrates an applicable example of a pixel circuit. Here, one pixel includes two n-channel transistors manufactured by a manufacturing method of a semiconductor device of one embodiment of the present invention. Further, digital time grayscale driving can be employed for the pixel circuit.

The configuration of the applicable pixel circuit and operation of a pixel employing digital time grayscale driving are described.

A pixel 520 includes a switching transistor 521, a driver transistor 522, a light-emitting element 524, and a capacitor 523. A gate electrode layer of the switching transistor 521 is connected to a scan line 526, a first electrode (one of a source electrode layer and a drain electrode layer) of the switching transistor 521 is connected to a signal line 525, and a second electrode (the other of the source electrode layer and the drain electrode layer) of the switching transistor 521 is connected to a gate electrode layer of the driver transistor 522. The gate electrode layer of the driver transistor 522 is connected to a power supply line 527 through the capacitor 523, a first electrode of the driver transistor 522 is connected to the power supply line 527, and a second electrode of the driver transistor 522 is connected to a first electrode (a pixel electrode) of the light-emitting element 524. A second electrode of the light-emitting element 524 corresponds to a common electrode 528. The common electrode 528 is electrically connected to a common potential line provided over the same substrate.

As the switching transistor 521 and the driver transistor 522, the transistor described in Embodiment 1 can be used as appropriate. In this manner, a highly reliable organic EL display panel can be provided.

The potential of the second electrode (the common electrode 528) of the light-emitting element 524 is set to be a low power supply potential. Note that the low power supply potential is lower than a high power supply potential supplied to the power supply line 527. For example, the low power supply potential can be GND, 0V, or the like. The high power supply potential and the low power supply potential are set to be higher than or equal to the forward threshold voltage of the light-emitting element 524, and the difference between the potentials is applied to the light-emitting element 524, whereby current is supplied to the light-emitting element 524, leading to light emission. The forward voltage of the light-emitting element 524 indicates a voltage at which a desired luminance is obtained, and includes at least a forward threshold voltage.

Note that gate capacitance of the driver transistor 522 may be used as a substitute for the capacitor 523, so that the capacitor 523 can be omitted. The gate capacitance of the driver transistor 522 may be formed between the channel formation region and the gate electrode layer.

Next, a signal input to the driver transistor 522 is described. In the case of a voltage-input voltage driving method, a video signal for turning on or off the driver transistor 522 without fail is input to the driver transistor 522. In order for the driver transistor 522 to operate in a linear region, voltage higher than the voltage of the power supply line 527 is applied to the gate electrode layer of the driver transistor 522. Note that voltage higher than or equal to voltage that is the sum of power supply line voltage and the threshold voltage Vth of the driver transistor 522 is applied to the signal line 525.

In the case of performing analog grayscale driving, a voltage greater than or equal to a voltage that is the sum of the forward voltage of the light-emitting element 524 and the threshold voltage Vth of the driver transistor 522 is applied to the gate electrode layer of the driver transistor 522. A video signal by which the driver transistor 522 is operated in a saturation region is input, so that current is supplied to the light-emitting element 524. In order for the driver transistor 522 to operate in a saturation region, the potential of the power supply line 527 is set higher than the gate potential of the driver transistor 522. When an analog video signal is used, it is possible to supply current to the light-emitting element 524 in accordance with the video signal and perform analog grayscale driving.

Note that the configuration of the pixel circuit of the present invention is not limited to that shown in FIG. 6C. For example, a switch, a resistor, a capacitor, a sensor, a transistor, a logic circuit, or the like may be added to the pixel circuit illustrated in FIG. 6C. A semiconductor device manufactured by a manufacturing method of a semiconductor device of one embodiment of the present invention can be used also for an element or a circuit included in the pixel circuit.

Note that this embodiment can be combined with any of the other embodiments and examples described in this specification as appropriate.

Embodiment 4

In this embodiment, structural examples of electronic devices each including a semiconductor device of one embodiment of the present invention are described.

Figure 7:
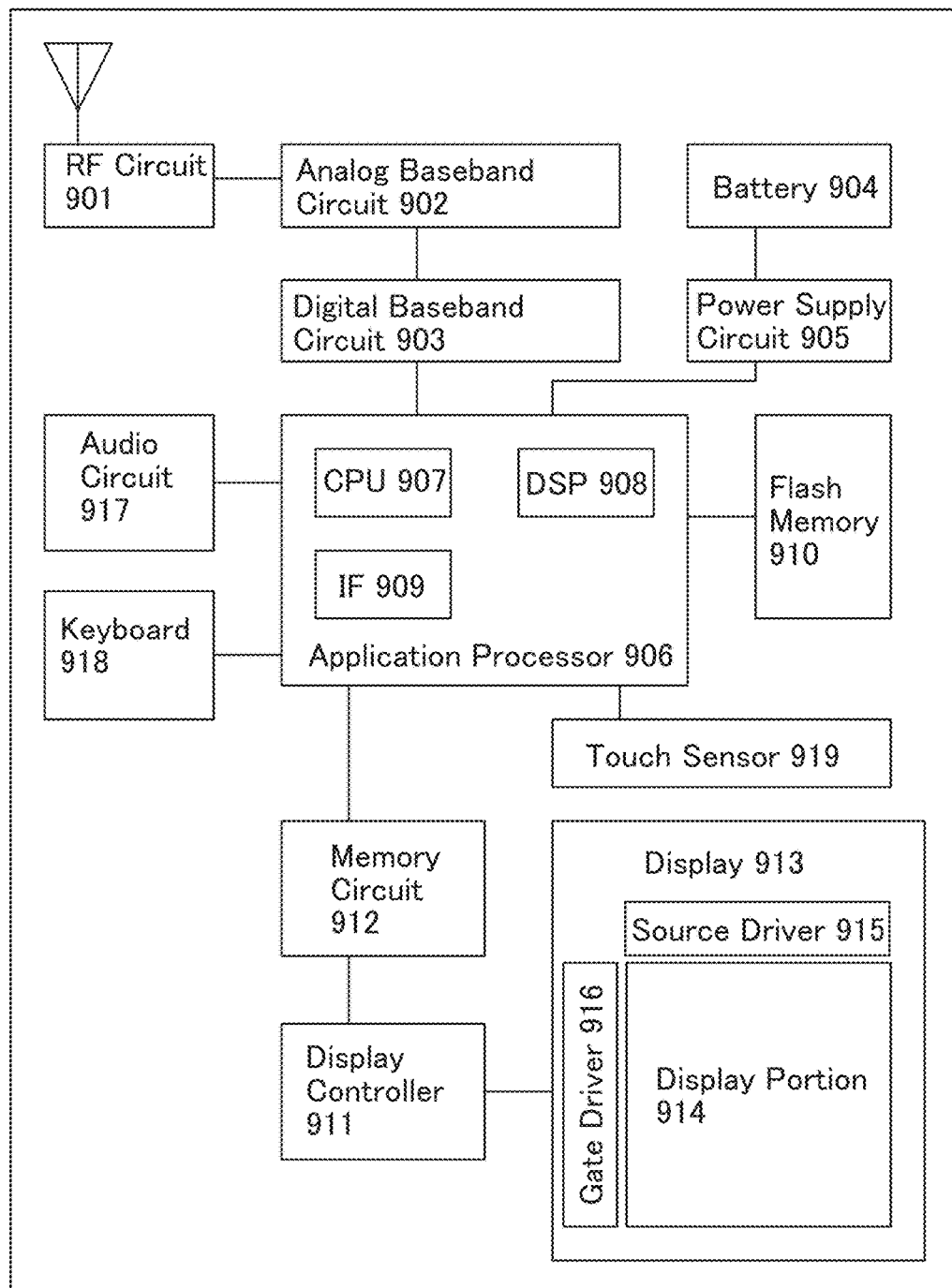
FIG. 7 illustrates a structural example of an electronic device of an embodiment.

FIG. 7 is a block diagram of an electronic device including the semiconductor device of one embodiment of the present invention.

FIGS. 8A to 8D are external views of electronic devices each including the semiconductor device of one embodiment of the present invention.

An electronic device illustrated in FIG. 7 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like.

The application processor 906 includes a CPU 907, a DSP 908, and an interface (IF) 909. Moreover, the memory circuit 912 can include an SRAM or a DRAM.

The transistor described in Embodiment 1 is applied to the memory circuit 912, whereby a highly reliable electronic device that can write and read data can be provided.

The transistor described in Embodiment 1 is applied to a register or the like included in the CPU 907 or the DSP 908, whereby a highly reliable electronic device that can write and read data can be provided.

Note that in the case where the off-state leakage current of the transistor described in Embodiment 1 is extremely small, the memory circuit 912 can store data for a long time and can have sufficiently reduced power consumption. Moreover, the CPU 907 or the DSP 908 can store the state before power gating in a register or the like during a period in which the power gating is performed.

Further, the display 913 includes a display portion 914, a source driver 915, and a gate driver 916.

The display portion 914 includes a plurality of pixels arranged in a matrix. The pixel includes a pixel circuit, and the pixel circuit is electrically connected to the gate driver 916.

The transistor described in Embodiment 1 can be used as appropriate in the pixel circuit or the gate driver 916. Accordingly, a highly reliable display can be provided.

Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like.

Figure 8A:
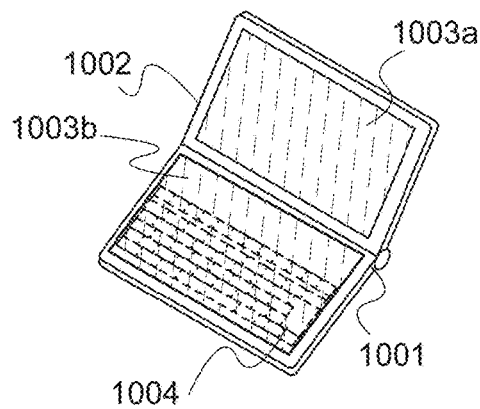
FIGS. 8A to 8D illustrate structural examples of electronic devices of an embodiment.

FIG. 8A illustrates a portable information terminal, which includes a main body 1001, a housing 1002, a display portion 1003*a*, a display portion 1003*b*, and the like. The display portion 1003*b* includes a touch panel. By touching 4 a keyboard button 100 displayed on the display portion 1003*b*, screen operation can be carried out, and text can be input. Needless to say, the display portion 1003*a* may function as a touch panel. A liquid crystal panel or an organic light-emitting panel is fabricated using the transistor described in Embodiment 1 as a switching element and applied to the display portion 1003*a* or 1003*b*, whereby a highly reliable portable information terminal can be provided.

The portable information terminal illustrated in FIG. 8A can have a function of displaying a variety of kinds of data (e.g., a still image, a moving image, and a text image), a function of displaying a calendar, a date, the time, or the like on the display portion, a function of operating or editing data displayed on the display portion, a function of controlling processing by a variety of kinds of software (programs), and the like. Further, an external connection terminal (an earphone terminal, a USB terminal, or the like), a recording medium insertion portion, or the like may be provided on the back surface or the side surface of the housing.

The portable information terminal illustrated in FIG. 8A may transmit and receive data wirelessly. Through wireless communication, desired book data or the like can be purchased and downloaded from an electronic book server.

Figure 8B:
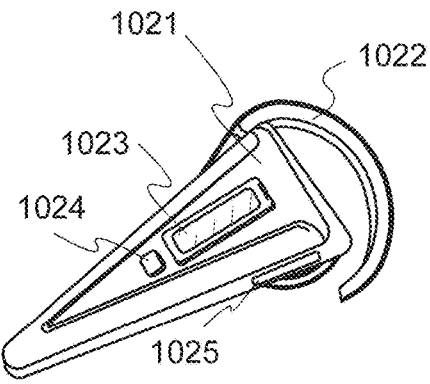

FIG. 8B illustrates a portable music player including, in a main body 1021, a display portion 1023, a fixing portion 1022 with which the portable music player can be worn on the ear, a speaker, an operation button 1024, an external memory slot 1025, and the like. A liquid crystal panel or an organic light-emitting panel is fabricated using the transistor described in Embodiment 1 as a switching element and applied to the display portion 1023, whereby a highly reliable portable music player can be provided.

Furthermore, when the portable music player illustrated in FIG. 8B has an antenna, a microphone function, or a wireless communication function and is used with a mobile phone, a user can talk on the phone wirelessly in a hands-free way while driving a car or the like.

Figure 8C:
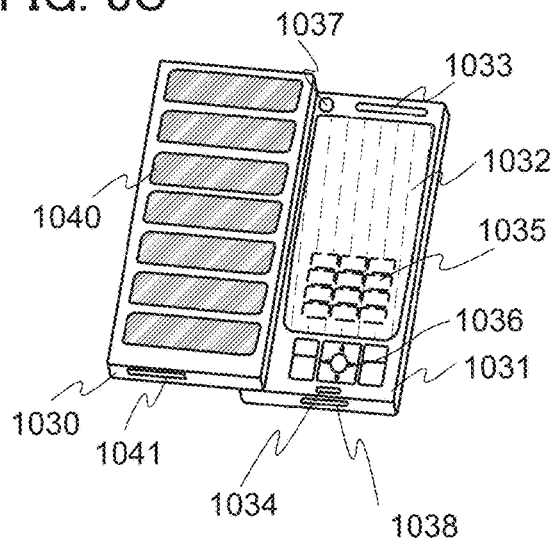

FIG. 8C illustrates a mobile phone that includes two housings, a housing 1030 and a housing 1031. The housing 1031 includes a display panel 1032, a speaker 1033, a microphone 1034, a pointing device 1036, a camera lens 1037, an external connection terminal 1038, and the like. The housing 1030 is provided with a solar cell 1040 for charging the mobile phone, an external memory slot 1041, and the like. In addition, an antenna is incorporated in the housing 1031. The transistor described in Embodiment 1 is applied to the display panel 1032, whereby a highly reliable mobile phone can be provided.

Further, the display panel 1032 includes a touch panel. A plurality of operation keys 1035 that are displayed as images are indicated by dotted lines in FIG. 8C. Note that a boosting circuit by which a voltage output from the solar cell 1040 is increased so as to be sufficiently high for each circuit is also included.

For example, a power transistor used for a power supply circuit such as a boosting circuit can also be formed when the semiconductor layer of the transistor described in the Embodiment 1 has a thickness greater than or equal to 2 μm and less than or equal to 50 μm.

In the display panel 1032, the direction of display is changed as appropriate depending on the application mode. Further, the mobile phone is provided with the camera lens 1037 on the same surface as the display panel 1032, and thus it can be used as a video phone. The speaker 1033 and the microphone 1034 can be used for videophone calls, recording, and playing sound, and the like as well as voice calls. Moreover, the housings 1030 and 1031 in a state where they are developed as illustrated in FIG. 8C can shift, by sliding, to a state where one is lapped over the other. Therefore, the size of the mobile phone can be reduced, which makes the mobile phone suitable for being carried around.

The external connection terminal 1038 can be connected to an AC adaptor and a variety of cables such as a USB cable, whereby charging and data communication with a personal computer or the like are possible. Further, by inserting a recording medium into the external memory slot 1041, a larger amount of data can be stored and moved.

Further, in addition to the above functions, an infrared communication function, a television reception function, or the like may be provided.

Figure 8D:
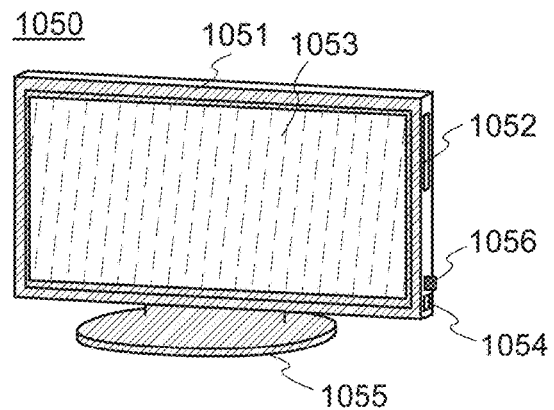

FIG. 8D illustrates an example of a television set. In a television set 1050, a display portion 1053 is incorporated in a housing 1051. Images can be displayed on the display portion 1053. Moreover, a CPU is incorporated in a stand 1055 for supporting the housing 1051. The transistor described in Embodiment 1 is applied to the display portion 1053 and the CPU, whereby the television set 1050 can be highly reliable.

The television set 1050 can be operated with an operation switch of the housing 1051 or a separate remote controller. Further, the remote controller may be provided with a display portion for displaying data output from the remote controller.

Note that the television set 1050 is provided with a receiver, a modem, and the like. With the use of the receiver, the television set 1050 can receive general TV broadcasts. Moreover, when the television set 1050 is connected to a communication network with or without wires via the modem, one-way (from a sender to a receiver) or two-way (between a sender and a receiver or between receivers) information communication can be performed.

Further, the television set 1050 is provided with an external connection terminal 1054, a storage medium recording and reproducing portion 1052, and an external memory slot. The external connection terminal 1054 can be connected to various types of cables such as a USB cable, whereby data communication with a personal computer or the like is possible. A disk storage medium is inserted into the storage medium recording and reproducing portion 1052, and reading data stored in the storage medium and writing data to the storage medium can be performed. In addition, an image, a video, or the like stored as data in an external memory 1056 inserted into the external memory slot can be displayed on the display portion 1053.

Further, in the case where the off-state leakage current of the transistor described in Embodiment 1 is extremely small, when the transistor is applied to the external memory 1056 or the CPU, the television set 1050 can have high reliability and sufficiently reduced power consumption.

Note that this embodiment can be combined with any of the other embodiments and examples described in this specification as appropriate.

Example

This example describes an observation result of a cross section of an electrode processed by the method described in Embodiment 1.

[Fabrication of Sample]

A silicon wafer was used as a substrate of the fabricated sample. The substrate was subjected to thermal oxidation, so that a thermal oxidation film was formed over the substrate surface. Next, an approximately 300-nm-thick oxynitride silicon film was formed over the thermal oxidation film by a plasma CVD method, then a surface of the oxynitride silicon film was planarized by chemical mechanical polishing (CMP).

Subsequently, an approximately 20-nm-thick oxide semiconductor film (OS1) and an approximately 15-nm-thick oxide semiconductor film (OS2) having a different composition from OS1 were deposited in this order by a sputtering method. After that, an approximately 100-nm-thick negative resist film was formed over the oxide semiconductor films, exposure was performed on the resist film by scanning of an electron beam, and development was performed, so that the resist film was patterned. Then, the oxide semiconductor films were etched using the resist film as a mask, and the resist film was removed, so that an island-shaped semiconductor layer was obtained.

Next, as a first conductive film, an approximately 20-nm-thick tungsten film was deposited by a sputtering method. Then, an approximately 30-nm-thick organic coating film and an approximately 150-nm-thick negative resist film were formed. Subsequently, exposure was performed on the resist film by scanning of an electron beam, then development treatment was performed, so that the resist film was patterned. Next, the organic coating film and the first conductive film were etched using the resist film as a mask, then the resist film and the organic coating film were removed to obtain a pair of first conductive layers.

Next, as a second conductive film, an approximately 10-nm-thick titanium nitride film was deposited by a sputtering method. Then, an approximately 20-nm-thick organic coating film and an approximately 100-nm-thick negative resist film were each formed. Subsequently, exposure was performed on the resist film by scanning of an electron beam, then development treatment was performed, so that the resist film was patterned.

Next, the resist film, the organic coating film, and the second conductive layer were etched. The etching conditions were as follows: the flow rate of $CH_4$ was 100 sccm, the ICP power was 2000 W, the bias power was 50 W, the pressure was 0.67 Pa, the substrate temperature was −10° C., and the etching time was 40 seconds.

The second conductive film was processed by the etching to obtain a pair of second conductive layers.

Then, after plasma treatment (ashing treatment) in an oxygen atmosphere, peeling treatment was conducted using a resist stripper, so that the remaining resist film and the remaining organic coating film were removed. The conditions of the ashing treatment were as follows: the flow rate of oxygen was 100 sccm, the RF bias power was 200 W, the pressure was 65 Pa, the substrate temperature was 60° C., and the ashing treatment time was 60 seconds.

Through the above steps, the sample in which the electrode was formed over the semiconductor film was obtained.

[Cross-Sectional Observation]

The cross-section of the fabricated sample was observed with a scanning transmission electron microscope (STEM).

Figure 9:
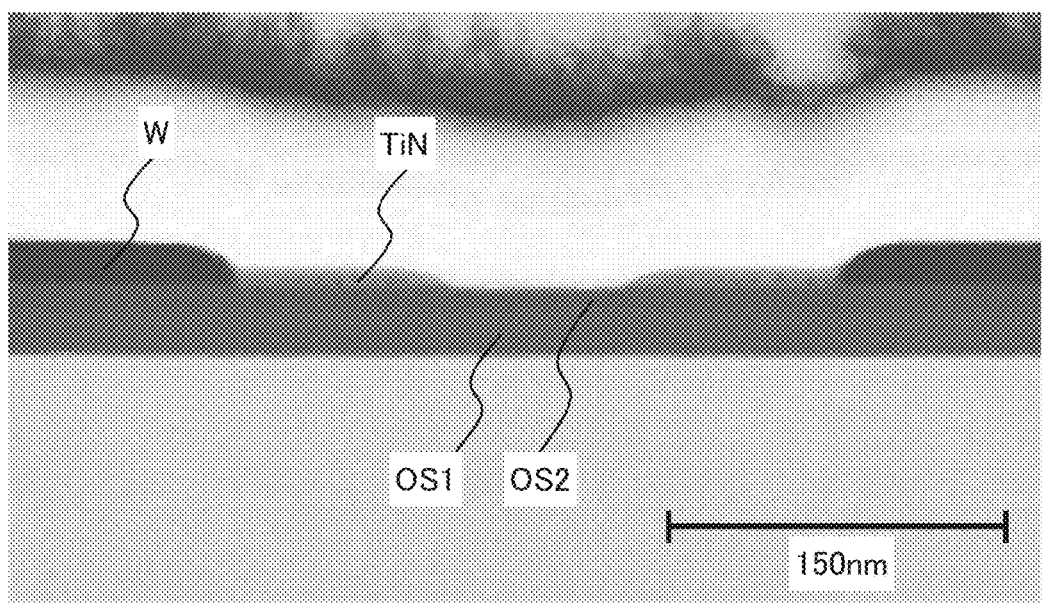
FIG. 9 is an image observed with a transmission electron microscope of an example.

FIG. 9 shows a STEM image of the observed cross-section.

From the cross-sectional observation image in FIG. 9, the following was confirmed. First, a pair of tungsten layers (first conductive layers) is positioned over a semiconductor layer. A pair of titanium nitride layers (second conductive layers) is positioned between the pair of tungsten layers. The titanium nitride layers are in contact with the tungsten layers at their side surfaces. The titanium nitride layers have first end portions in contact with the tungsten layers and second end portions with the tapered shape opposite to the first end portions. End portions of the tungsten layers are rounded. The top surface of the titanium nitride layer is lower than that of the tungsten layer.

Thus, it is confirmed that an electrode having a shape that can be used for a semiconductor device of one embodiment of the present invention can be formed by the method described in Embodiment 1.

This application is based on Japanese Patent Application serial No. 2013-061883 filed with Japan Patent Office on Mar. 25, 2013, the entire contents of which are hereby incorporated by reference.

What is claimed is:

1. A semiconductor device comprising:
a semiconductor layer over a first insulating film;
a first conductive layer and a second conductive layer over and in physical contact with the semiconductor layer and the first insulating film;
a second insulating film over the first conductive layer and the second conductive layer; and
a gate electrode overlapping with the semiconductor layer,
wherein the second conductive layer is thinner than the first conductive layer, and
wherein the second conductive layer is in physical contact with a part of an upper surface of the first conductive layer.

2. The semiconductor device according to claim 1, wherein the semiconductor layer comprises an oxide semiconductor, and
wherein the first conductive layer is in physical contact with a side surface of the semiconductor layer.

3. The semiconductor device according to claim 1, wherein the first conductive layer comprises tungsten, and wherein the second conductive layer comprises titanium nitride.

4. A semiconductor device comprising:
a semiconductor layer over an insulating surface;
a first conductive layer, a second conductive layer, a third conductive layer, and a fourth conductive layer over and in physical contact with the semiconductor layer;
a gate insulating film over the first conductive layer, the second conductive layer, the third conductive layer, the fourth conductive layer, and the semiconductor layer; and
a gate electrode overlapping with the semiconductor layer with the gate insulating film interposed therebetween,
wherein the third conductive layer is in physical contact with a side surface and a part of an upper surface of the first conductive layer,
wherein the fourth conductive layer is in physical contact with a side surface and a part of a part of an upper surface of the second conductive layer,
wherein the third conductive layer is thinner than the first conductive layer,
wherein the fourth conductive layer is thinner than the second conductive layer,
wherein the third conductive layer surrounds the first conductive layer, and
wherein the fourth conductive layer surrounds the second conductive layer.

5. The semiconductor device according to claim 4, wherein the semiconductor layer comprises an oxide semiconductor.

6. The semiconductor device according to claim 4, wherein the first conductive layer and the second conductive layer comprise tungsten, and
wherein the third conductive layer comprises titanium nitride.

7. A semiconductor device comprising:
a semiconductor layer over an insulating surface;
a first conductive layer and a second conductive layer over the semiconductor layer;
a third conductive layer over and in physical contact with the semiconductor layer and the first conductive layer;
a fourth conductive layer over and in physical contact with the semiconductor layer and the second conductive layer;
an insulating film over the first conductive layer, the second conductive layer, the third conductive layer, the fourth conductive layer, and the semiconductor layer; and
a gate electrode over the insulating film,
wherein an end portion of the third conductive layer and an end portion of the fourth conductive layer are positioned between an end portion of the first conductive layer and an end portion of the second conductive layer over the semiconductor layer,
wherein each of the third conductive layer and the fourth conductive layer has a smaller thickness than that of each of the first conductive layer and the second conductive layer,
wherein the third conductive layer is in contact with a side surface and a part of an upper surface of the first conductive layer,
wherein the fourth conductive layer is in contact with a side surface and a part of an upper surface of the second conductive layer,
wherein the third conductive layer surrounds the first conductive layer, and
wherein the fourth conductive layer surrounds the second conductive layer.

8. The semiconductor device according to claim 7, wherein the semiconductor layer comprises an oxide semiconductor.

9. The semiconductor device according to claim 7, wherein the first conductive layer and the second conductive layer comprise tungsten, and
wherein the third conductive layer comprises titanium nitride.

* * * * *